(12) United States Patent
Sonobe

(10) Patent No.: US 12,080,822 B2
(45) Date of Patent: *Sep. 3, 2024

(54) PHOTODETECTOR AND METHOD FOR MANUFACTURING PHOTODETECTOR

(71) Applicant: HAMAMATSU PHOTONICS K.K., Hamamatsu (JP)

(72) Inventor: Hironori Sonobe, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 423 days.

This patent is subject to a terminal disclaimer.

(21) Appl. No.: 17/311,798

(22) PCT Filed: Nov. 29, 2019

(86) PCT No.: PCT/JP2019/046908
§ 371 (c)(1),
(2) Date: Jun. 8, 2021

(87) PCT Pub. No.: WO2020/121858
PCT Pub. Date: Jun. 18, 2020

(65) Prior Publication Data
US 2022/0037548 A1    Feb. 3, 2022

(30) Foreign Application Priority Data
Dec. 12, 2018   (JP) ................. 2018-232892

(51) Int. Cl.
*H01L 31/107*   (2006.01)
*G01J 1/44*   (2006.01)
(Continued)

(52) U.S. Cl.
CPC .............. *H01L 31/107* (2013.01); *G01J 1/44* (2013.01); *H01L 27/1446* (2013.01); *H01L 31/02027* (2013.01); *G01J 2001/4466* (2013.01)

(58) Field of Classification Search
CPC ............... H01L 27/1446; H01L 31/107; H01L 31/02027; G01J 2001/4466–4473
See application file for complete search history.

(56) References Cited

U.S. PATENT DOCUMENTS

| 4,181,863 A | 1/1980 | Parker |
| 4,247,186 A | 1/1981 | Uchidoi |
| (Continued) |

FOREIGN PATENT DOCUMENTS

| CN | 1516362 A | 7/2004 |
| CN | 200950235 A | 9/2007 |
| (Continued) |

OTHER PUBLICATIONS

Machine translation of JP H06224463 A (Year: 2023).*
(Continued)

*Primary Examiner* — Jose R Diaz
(74) *Attorney, Agent, or Firm* — Faegre Drinker Biddle & Reath LLP

(57) ABSTRACT

In a light detection device, the semiconductor substrate forms an APD and a temperature compensation diode so as to be spaced apart from each other. The semiconductor substrate includes a peripheral carrier absorbing portion configured to absorb carriers located at the periphery, between the APD and the temperature compensation diode when viewed from the direction perpendicular to the main surface. When viewed from the direction perpendicular to the main surface, on a line segment connecting the APD and the temperature compensation diode at the shortest distance, the shortest distance between the APD and the peripheral carrier absorbing portion is smaller than the shortest distance between the temperature compensation diode and a portion, which is closest to the APD, of edges of the peripheral carrier absorbing portion.

2 Claims, 10 Drawing Sheets

(51) Int. Cl.
*H01L 27/144* (2006.01)
*H01L 31/02* (2006.01)

(56) References Cited

U.S. PATENT DOCUMENTS

| | | | |
|---|---|---|---|
| 4,292,514 | A | 9/1981 | Ohtomo |
| 4,464,048 | A | 8/1984 | Farlow |
| 4,948,989 | A | 8/1990 | Spratt |
| 5,548,112 | A | 8/1996 | Nakase et al. |
| 5,578,815 | A | 11/1996 | Nakase et al. |
| 6,313,459 | B1 | 11/2001 | Hoffe et al. |
| 6,504,140 | B1 | 1/2003 | Ueno et al. |
| 8,350,351 | B2 | 1/2013 | Koyama |
| 9,954,124 | B1 | 4/2018 | Kuznetsov |
| 10,064,585 | B2 | 9/2018 | Kimura et al. |
| 11,513,002 | B2 | 11/2022 | Sonobe et al. |
| 2003/0117121 | A1 | 6/2003 | Prescott |
| 2005/0092896 | A1 | 5/2005 | Ichino |
| 2008/0138092 | A1 | 6/2008 | Nagakubo |
| 2012/0101614 | A1 | 4/2012 | Ghaemi et al. |
| 2015/0177394 | A1 | 6/2015 | Dolinsky et al. |
| 2016/0084964 | A1 | 3/2016 | Kimura et al. |
| 2016/0273959 | A1 | 9/2016 | Wang |
| 2016/0373126 | A1 | 12/2016 | Kim et al. |
| 2017/0031009 | A1 | 2/2017 | Davidovic et al. |
| 2018/0180473 | A1 | 6/2018 | Clemens et al. |
| 2018/0214057 | A1 | 8/2018 | Schultz et al. |
| 2018/0266881 | A1 | 9/2018 | Fujiwara et al. |
| 2021/0134862 | A1 | 5/2021 | Ishida et al. |
| 2022/0020786 | A1* | 1/2022 | Sonobe ............... H01L 27/1443 |
| 2022/0020806 | A1 | 1/2022 | Sonobe et al. |
| 2022/0026268 | A1 | 1/2022 | Sonobe et al. |
| 2022/0026269 | A1 | 1/2022 | Sonobe |
| 2022/0026270 | A1 | 1/2022 | Sonobe |
| 2022/0037548 | A1 | 2/2022 | Sonobe |
| 2022/0037852 | A1 | 2/2022 | Jung et al. |
| 2022/0246782 | A1 | 8/2022 | Inoue et al. |
| 2023/0083263 | A1 | 3/2023 | Fujiwara et al. |

FOREIGN PATENT DOCUMENTS

| | | | |
|---|---|---|---|
| CN | 200959101 | A | 10/2007 |
| CN | 101484999 | A | 7/2009 |
| CN | 201601136 | U | 10/2010 |
| CN | 103728030 | A | 4/2014 |
| CN | 103890972 | A | 6/2014 |
| CN | 103907206 | A | 7/2014 |
| DE | 102013100696 | B3 | 11/2013 |
| EP | 1006591 | A2 | 6/2000 |
| EP | 2040308 | A1 | 3/2009 |
| EP | 2755235 | A1 | 7/2014 |
| GB | 1231906 | | 5/1971 |
| GB | 1503088 | A | 3/1978 |
| GB | 1532262 | | 11/1978 |
| GB | 1535824 | | 12/1978 |
| JP | S50-062389 | A | 5/1975 |
| JP | S53-041280 | A | 4/1978 |
| JP | S55-006924 | U | 1/1980 |
| JP | S55-127082 | A | 10/1980 |
| JP | S60-178673 | A | 9/1985 |
| JP | S60-180347 | A | 9/1985 |
| JP | S60-211886 | A | 10/1985 |
| JP | S61-038975 | U | 3/1986 |
| JP | S61-289677 | A | 12/1986 |
| JP | S62-239727 | A | 10/1987 |
| JP | S62-279671 | A | 12/1987 |
| JP | S64-013768 | A | 1/1989 |
| JP | H01-118714 | A | 5/1989 |
| JP | H03-021082 | A | 1/1991 |
| JP | H03-278482 | A | 12/1991 |
| JP | H04-111477 | A | 4/1992 |
| JP | H04-256376 | A | 9/1992 |
| JP | H05-235396 | A | 9/1993 |
| JP | H05-275668 | A | 10/1993 |
| JP | H06-224463 | A | 8/1994 |
| JP | H07-027607 | A | 1/1995 |
| JP | H7-063854 | A | 3/1995 |
| JP | H7-263653 | A | 10/1995 |
| JP | H08-207281 | A | 8/1996 |
| JP | H10-247717 | A | 9/1998 |
| JP | H11-275755 | A | 10/1999 |
| JP | H11-284445 | A | 10/1999 |
| JP | 2002-204149 | A | 7/2002 |
| JP | 2004-281488 | A | 10/2004 |
| JP | 2004-289206 | A | 10/2004 |
| JP | 2004-303878 | A | 10/2004 |
| JP | 2006-080416 | A | 3/2006 |
| JP | 2007-266251 | A | 10/2007 |
| JP | 2007-281509 | A | 10/2007 |
| JP | 2008-148068 | A | 6/2008 |
| JP | 2009-038157 | A | 2/2009 |
| JP | 2013-164263 | A | 8/2013 |
| JP | 2014-142340 | A | 8/2014 |
| JP | 2018-174308 | A | 11/2018 |
| SE | 417145 | B | 2/1981 |
| TW | 201743459 | A | 12/2017 |

OTHER PUBLICATIONS

International Preliminary Report on Patentability mailed Jun. 24, 2021 for PCT/JP2019/046909.
International Preliminary Report on Patentability mailed Jun. 24, 2021 for PCT/JP2019/046900.
International Preliminary Report on Patentability mailed Jun. 24, 2021 for PCT/JP2019/046901.
International Preliminary Report on Patentability mailed Jun. 24, 2021 for PCT/JP2019/046881.
International Preliminary Report on Patentability mailed Jun. 24, 2021 for PCT/JP2019/046880.
International Preliminary Report on Patentability mailed Jun. 24, 2021 for PCT/JP2019/046907.
International Preliminary Report on Patentability mailed Jun. 24, 2021 for PCT/JP2019/046908.

* cited by examiner

PHOTODETECTOR AND METHOD FOR MANUFACTURING PHOTODETECTOR

TECHNICAL FIELD

The present invention relates to a light detection device and a method for manufacturing a light detection device.

BACKGROUND ART

A configuration is known in which a bias voltage applied to an avalanche photodiode is controlled in order to provide stable light detection with respect to temperature (for example, Patent Literature 1). In Patent Literature 1, a voltage corresponding to the breakdown voltage of a temperature compensation diode is applied to the avalanche photodiode as a bias voltage. Hereinafter, in this specification, the "avalanche photodiode" will be referred to as an "APD".

CITATION LIST

Patent Literature

Patent Literature 1: Japanese Unexamined Patent Publication No. H07-27607

SUMMARY OF INVENTION

Technical Problem

In Patent Literature 1, in order to provide temperature compensation for the multiplication factor of an APD for signal detection, an APD having the same temperature characteristics as the APD for signal detection is used as the temperature compensation diode described above. The closer the temperature characteristics of the APD for signal detection and the APD as a temperature compensation diode are, the higher the accuracy of temperature compensation of the light detection device can be. However, in order to achieve the desired temperature compensation accuracy, it has been necessary to make an examination for selecting and combining APDs having desired temperature characteristics with respect to the relationship between the amplification factor and the bias voltage. For this reason, it has been difficult to reduce the manufacturing cost of a light detection device including two APDs having desired temperature characteristics.

An object of one aspect of the present invention is to provide a light detection device having improved detection accuracy while suppressing the manufacturing cost. An object of another aspect of the present invention is to provide a light detection device having improved detection accuracy while reducing the manufacturing cost. An object of still another aspect of the present invention is to provide a method for manufacturing a light detection device having improved detection accuracy while suppressing the manufacturing cost.

Solution to Problem

In the light detection device according to one aspect of the present invention, a voltage corresponding to a breakdown voltage applied to a temperature compensation diode is applied to an APD as a bias voltage to provide temperature compensation for the multiplication factor of the APD. The light detection device includes a semiconductor substrate. The semiconductor substrate has a first main surface and a second main surface facing each other. On the semiconductor substrate, the APD and the temperature compensation diode are formed so as to be spaced apart from each other when viewed from a direction perpendicular to the first main surface. The semiconductor substrate includes a peripheral carrier absorbing portion between the APD and the temperature compensation diode when viewed from the direction perpendicular to the first main surface. The peripheral carrier absorbing portion is configured to absorb carriers located at the periphery. When viewed from the direction perpendicular to the first main surface, on a line segment connecting the APD and the temperature compensation diode to each other at a shortest distance, a shortest distance between the APD and the peripheral carrier absorbing portion is smaller than a shortest distance between the temperature compensation diode and a portion, which is closest to the APD, of an edge of the peripheral carrier absorbing portion.

In the one aspect described above, the APD and the temperature compensation diode are formed on the same semiconductor substrate. In this case, the temperature compensation diode and the APD having the same temperature characteristics with respect to the amplification factor and the bias voltage can be formed more easily and accurately than in a case where the temperature compensation diode and the APD are formed on different semiconductor substrates. Therefore, temperature compensation can be ensured for the multiplication factor while suppressing the manufacturing cost.

When a breakdown voltage is applied to the temperature compensation diode, the temperature compensation diode may emit light. When the temperature compensation diode emits light, carriers are generated in the semiconductor substrate due to the light emitted from the temperature compensation diode. Therefore, in a state in which the temperature compensation diode and the APD are formed on the same semiconductor substrate, the carriers may affect the detection result of the APD.

In the one aspect described above, the peripheral carrier absorbing portion is located between the APD and the temperature compensation diode. When viewed from the direction perpendicular to the first main surface, on the line segment connecting the APD and the temperature compensation diode to each other at the shortest distance, the shortest distance between the APD and the peripheral carrier absorbing portion is smaller than the shortest distance between the temperature compensation diode and a portion, which is closest to the APD, of an edge of the peripheral carrier absorbing portion. Therefore, the carriers generated due to the light emission of the temperature compensation diode are absorbed at the peripheral carrier absorbing portion before reaching the APD. As a result, the carriers due to the temperature compensation diode are suppressed from reaching the APD, enabling improvement of the detection accuracy.

Therefore, in the light detection device described above, temperature compensation is ensured for the multiplication factor while suppressing the manufacturing cost, enabling improvement of the detection accuracy.

In the one aspect described above, the light detection device may include a first electrode, a second electrode, and a third electrode. The first electrode may be connected to the APD and be configured to output a signal from the APD. The second electrode may be connected to the temperature compensation diode. The third electrode may be connected to the peripheral carrier absorbing portion. In this case, a desired potential can be applied to each of the APD, the temperature compensation diode, and the peripheral carrier absorbing portion. When a voltage is applied to the peripheral carrier absorbing portion, the carriers generated in the temperature compensation diode can be further absorbed.

In the one aspect described above, a fourth electrode may be provided. The APD, the temperature compensation diode, and the peripheral carrier absorbing portion may be connected to the fourth electrode in parallel with each other. Since the APD and the temperature compensation diode are connected in parallel to each other, a potential corresponding to the breakdown voltage of the temperature compensation diode can be applied to the APD. Since the peripheral carrier absorbing portion is also connected in parallel to the APD and the temperature compensation diode, a potential can be applied to the peripheral carrier absorbing portion without providing a separate power supply. When a voltage is applied to the peripheral carrier absorbing portion, the carriers generated in the temperature compensation diode can be further absorbed.

In the one aspect described above, the semiconductor substrate may include a semiconductor region of a first conductivity type. Each of the APD and the temperature compensation diode may include a first semiconductor layer and a second semiconductor layer. The first semiconductor layer may be a second conductivity type different from the first conductivity type. The second semiconductor layer may be a first conductivity type having a higher impurity concentration than the semiconductor region. The second semiconductor layer may be located between the semiconductor region and the first semiconductor layer. In this case, the temperature compensation diode has the same configuration as the APD. Therefore, it is possible to easily form a temperature compensation diode whose temperature characteristics with respect to the amplification factor and the bias voltage are very similar to those of the APD.

In the one aspect described above, the peripheral carrier absorbing portion may include a third semiconductor layer of the second conductivity type. In this case, the carriers generated in the temperature compensation diode can be further absorbed at the peripheral carrier absorbing portion.

In the one aspect described above, the peripheral carrier absorbing portion may include a third semiconductor layer of the first conductivity type. In this case, the carriers generated in the temperature compensation diode can be further absorbed at the peripheral carrier absorbing portion.

In the one aspect described above, when viewed from the direction perpendicular to the first main surface, on the line segment connecting the APD and the temperature compensation diode to each other at the shortest distance, a shortest distance between the first semiconductor layer of the APD and the peripheral carrier absorbing portion may be smaller than a shortest distance between the portion of the peripheral carrier absorbing portion and the first semiconductor layer of the temperature compensation diode.

In the one aspect described above, when viewed from the direction perpendicular to the first main surface, on the line segment connecting the APD and the temperature compensation diode to each other at the shortest distance, a shortest distance between the second semiconductor layer of the APD and the peripheral carrier absorbing portion may be smaller than a shortest distance between the portion of the peripheral carrier absorbing portion and the second semiconductor layer of the temperature compensation diode.

In the one aspect described above, an impurity concentration in the second semiconductor layer of the temperature compensation diode may be higher than an impurity concentration in the second semiconductor layer of the APD. In this case, temperature compensation can be ensured for the multiplication factor of the APD operating in a linear mode.

In the one aspect described above, an impurity concentration in the second semiconductor layer of the temperature compensation diode may be lower than an impurity concentration in the second semiconductor layer of the APD. In this case, temperature compensation can be ensured for the multiplication factor of the APD arranged to operate in Geiger mode.

In the one aspect described above, an APD array including the APD may be formed on a side of the first main surface of the semiconductor substrate. The peripheral carrier absorbing portion may be located between the APD array and the temperature compensation diode when viewed from the direction perpendicular to the first main surface. In this case, even when a plurality of APDs are formed on the semiconductor substrate, the carriers from the temperature compensation diode are suppressed from reaching the plurality of APDs, enabling improvement of the detection accuracy.

A light detection device according to another aspect of the present invention includes a semiconductor substrate. The semiconductor substrate has a first main surface and a second main surface facing each other. The semiconductor substrate has a first APD, a second APD, and a peripheral carrier absorbing portion. The first APD has a light incidence surface on a side of the first main surface. The second APD is spaced apart from the first APD when viewed from a direction perpendicular to the first main surface and is shielded from light. The peripheral carrier absorbing portion is formed between the first and second APDs when viewed from the direction perpendicular to the first main surface. The peripheral carrier absorbing portion is configured to absorb carriers located at the periphery. When viewed from the direction perpendicular to the first main surface, on a line segment connecting the first APD and the second APD to each other at a shortest distance, a shortest distance between the first APD and the peripheral carrier absorbing portion is smaller than a shortest distance between the second APD and a portion, which is closest to the first APD, of an edge of the peripheral carrier absorbing portion.

In another aspect described above, two APDs are formed on the same semiconductor substrate. In this case, two APDs having desired temperature characteristics can be formed more easily and accurately than in a case where two APDs are formed on different semiconductor substrates. Therefore, a light detection device including two APDs having desired temperature characteristics can be provided while suppressing the manufacturing cost.

When a breakdown voltage is applied to the second APD, the second APD may emit light. When one APD emits light in a state in which two APDs are formed on the same semiconductor substrate, carriers are generated in the semiconductor substrate due to the light emitted from the one APD. Therefore, the carriers generated in the second APD may affect the detection result of the first APD.

In another aspect described above, the peripheral carrier absorbing portion is located between the first APD and the second APD. When viewed from the direction perpendicular to the first main surface, on a line segment connecting the first APD and the second APD to each other at a shortest distance, a shortest distance between the first APD and the peripheral carrier absorbing portion is smaller than a shortest distance between the second APD and a portion, which is closest to the first APD, of an edge of the peripheral carrier absorbing portion. Therefore, the carriers generated due to the light emission of the second APD are absorbed at the peripheral carrier absorbing portion before reaching the first APD. As a result, the carriers due to the second APD are suppressed from reaching the first APD, enabling improvement of the detection accuracy.

Therefore, in the light detection device described above, the detection accuracy can be improved while suppressing the manufacturing cost.

A method for manufacturing a light detection device according to still another aspect of the present invention includes: preparing a semiconductor wafer; and implanting impurity ions into the semiconductor wafer to form a semiconductor substrate. The semiconductor wafer has a first main surface and includes a semiconductor region of a first conductivity type. On the semiconductor substrate, an avalanche photodiode and a temperature compensation diode are formed so as to have a first main surface and a second main surface facing the first main surface and so as to be spaced apart from each other when viewed from a direction perpendicular to the first main surface. The light detection device is a light detection device which includes the semiconductor substrate and in which a voltage corresponding to a breakdown voltage applied to the temperature compensation diode is applied to the avalanche photodiode as a bias voltage to provide temperature compensation for a multiplication factor of the avalanche photodiode. The forming the semiconductor substrate includes a first ion implantation process and a second ion implantation process. In the first ion implantation process, ions are implanted into a first portion and a second portion in the semiconductor wafer, which are spaced apart from each other when viewed from the direction perpendicular to the first main surface, to form a first semiconductor layer and a second semiconductor layer in each of the first and second portions. The first semiconductor layer is a second conductivity type different from the first conductivity type. The second semiconductor layer is located between the semiconductor region and the first semiconductor layer. The second semiconductor layer is a first conductivity type having a higher impurity concentration than the semiconductor region. In the second ion implantation process, ions are further implanted into the second semiconductor layer in the first portion.

In still another aspect described above, the APD and the temperature compensation diode are formed on the same semiconductor substrate. In this case, the temperature compensation diode and the APD having the same temperature characteristics with respect to the amplification factor and the bias voltage can be manufactured more easily and accurately than that in a case where the temperature compensation diode and the APD are formed on different semiconductor substrates. In other words, temperature compensation can be ensured for the multiplication factor while suppressing the manufacturing cost.

In still another aspect described above, there are the first ion implantation process and the second ion implantation process. In the first ion implantation process, ions are injected into the first portion and the second portion to form the first semiconductor layer and the second semiconductor layer in each of the first and second portions. Then, in the second ion implantation process, ions are further implanted into the second semiconductor layer in the first portion. In this case, the temperature compensation diode and the APD each of which is set to the desired breakdown voltage can be easily manufactured while having the same temperature characteristics with respect to the amplification factor and the bias voltage. When each of the temperature compensation diode and the APD is set to the desired breakdown voltage, the detection accuracy can be improved.

Therefore, in the manufacturing method described above, temperature compensation is ensured for the multiplication factor while suppressing the manufacturing cost, enabling improvement of the detection accuracy.

In still another aspect described above, the first ion implantation process may include: forming the first semiconductor layer in each of the first and second portions and forming a third semiconductor layer of the second conductivity type in the third portion by one ion implantation process; and forming the second semiconductor layer in each of the first and second portions. The third portion may be spaced apart from the first and second portions when viewed from the direction perpendicular to the first main surface. The first semiconductor layer and the third semiconductor layer may be formed by implanting impurity ions of the second conductivity type into the first and second portions and the third portion. The second semiconductor layer may be formed by implanting impurity ions of the first conductivity type into the first and second portions. In this case, the peripheral carrier absorbing portion is formed without increasing the number of ion implantation processes. Therefore, the manufacturing cost is reduced.

Advantageous Effects of Invention

According to one aspect of the present invention, it is possible to provide a light detection device having improved detection accuracy while suppressing the manufacturing cost. According to another aspect of the present invention, it is possible to provide a light detection device having improved detection accuracy while suppressing the manufacturing cost. According to still another aspect of the present invention, it is possible to provide a method for manufacturing a light detection device having improved detection accuracy while suppressing the manufacturing cost.

DESCRIPTION OF EMBODIMENTS

Figure 1:
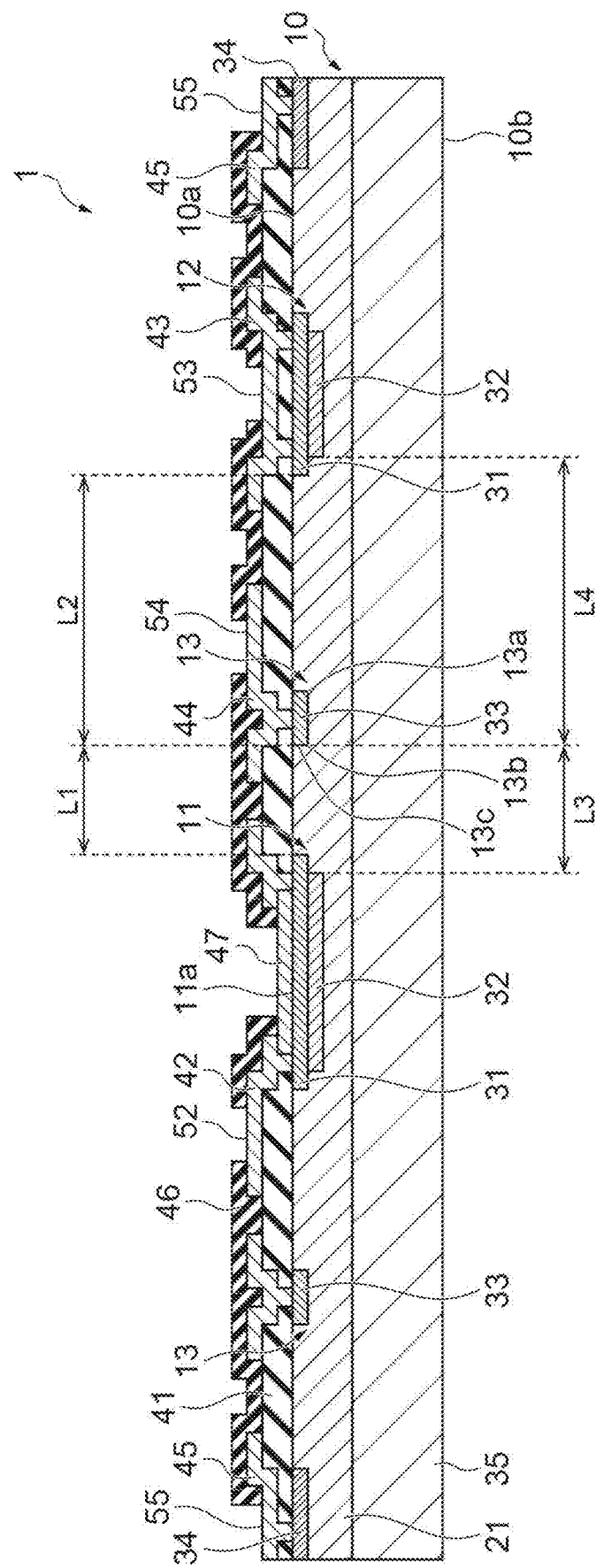
FIG. 1 is a schematic cross-sectional view of a light detection device according to the present embodiment.

Hereinafter, embodiments of the present invention will be described in detail with reference to the accompanying diagrams. In addition, in the description, the same elements or elements having the same function are denoted by the same reference numerals, and repeated descriptions thereof will be omitted.

Figure 2:
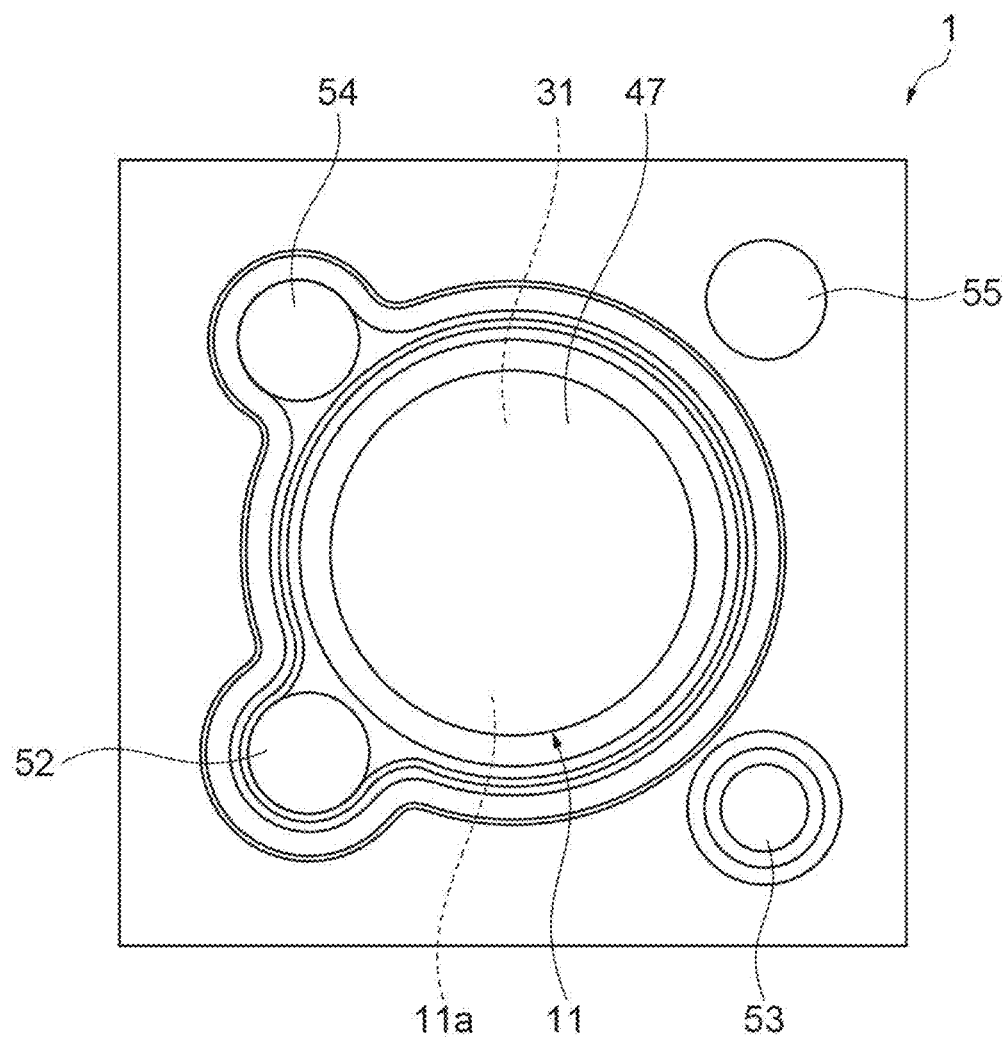
FIG. 2 is a plan view of the light detection device.
Figure 3:
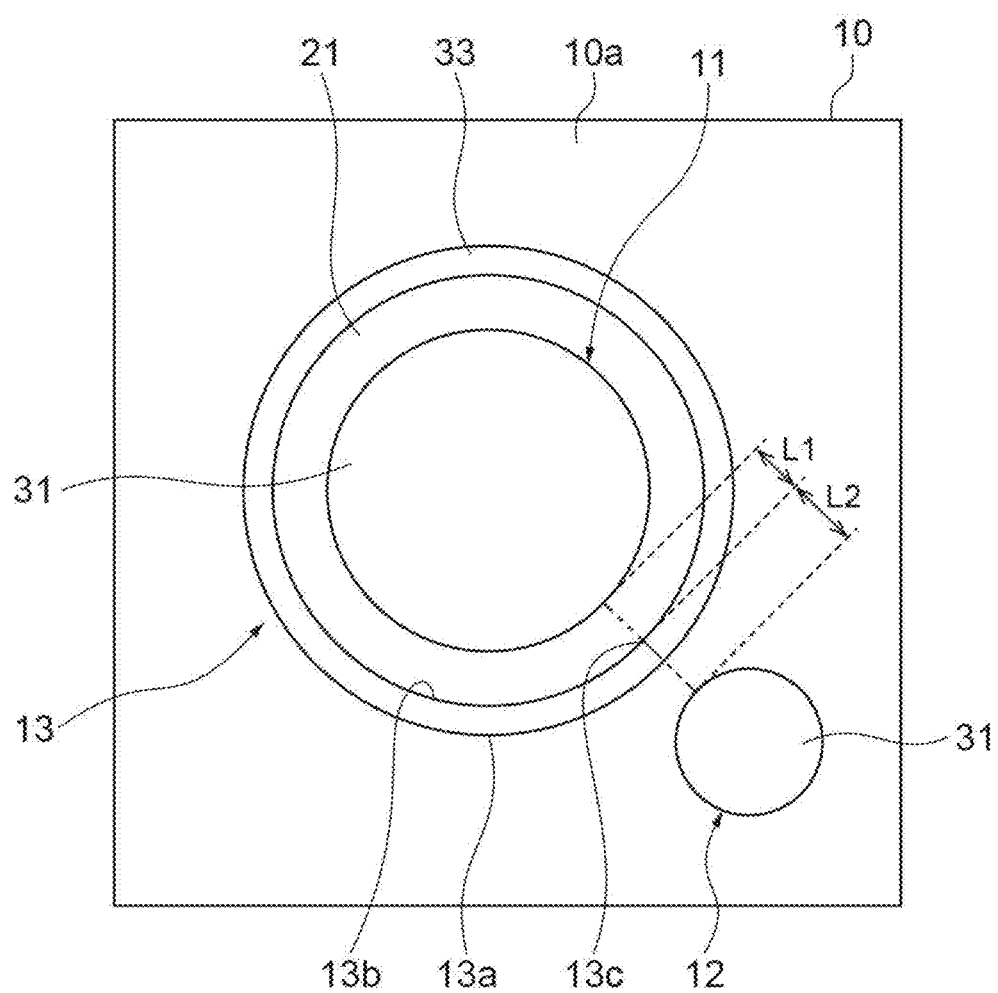
FIG. 3 is a schematic plan view of a semiconductor substrate.

First, a light detection device according to the present embodiment will be described with reference to FIGS. 1 to 3. A light detection device 1 includes a semiconductor substrate 10. FIG. 1 is a schematic cross-sectional view of a light detection device. FIG. 2 is a plan view of the light detection device. FIG. 3 is a schematic plan view of a semiconductor substrate included in the light detection device.

The semiconductor substrate 10 includes an APD 11 and a temperature compensation diode 12. The APD 11 and the temperature compensation diode 12 have the same temperature characteristics with respect to the relationship between the amplification factor and the bias voltage. In the present embodiment, the breakdown voltage of the APD 11 and the breakdown voltage of the temperature compensation diode 12 are different. In the present embodiment, the breakdown voltage of the APD 11 is higher than the breakdown voltage of the temperature compensation diode 12.

In the light detection device 1, since a breakdown voltage is applied to the temperature compensation diode 12, a voltage corresponding to the breakdown voltage is applied to the APD 11 as a bias voltage. In the present embodiment, the breakdown voltage of the temperature compensation diode 12 is applied to the APD 11 as a bias voltage. The APD 11 and the temperature compensation diode 12 have the same temperature characteristics with respect to the relationship between the amplification factor and the bias voltage. In this case, when the ambient temperature changes, the breakdown voltage applied to the temperature compensation diode 12 changes. By the change in the breakdown voltage applied to the temperature compensation diode 12, the bias voltage applied to the APD 11 also changes according to the ambient temperature so that the amplification factor of the APD 11 is maintained. That is, in the light detection device 1, the temperature compensation diode 12 provides temperature compensation for the amplification factor of the APD 11.

As illustrated in FIG. 1, the semiconductor substrate 10 has main surfaces 10a and 10b facing each other. The APD 11 and the temperature compensation diode 12 are formed on the semiconductor substrate 10 so as to be spaced apart from each other when viewed from a direction perpendicular to the main surface 10a. The APD 11 has a light incidence surface 11a on the main surface 10a side. The temperature compensation diode 12 is a light-shielded APD.

The semiconductor substrate 10 includes a peripheral carrier absorbing portion 13 in addition to the APD 11 and the temperature compensation diode 12. A part of the peripheral carrier absorbing portion 13 is located between the APD 11 and the temperature compensation diode 12 when viewed from the direction perpendicular to the main surface 10a. The peripheral carrier absorbing portion 13 surrounds the APD 11. The peripheral carrier absorbing portion 13 is a region that absorbs carriers located at the periphery.

Next, the configuration of the light detection device according to the present embodiment will be described in more detail with reference to FIG. 1. The semiconductor substrate 10 includes a semiconductor region 21 and semiconductor layers 31, 32, 33, 34, and 35. Each of the APD 11 and the temperature compensation diode 12 includes the semiconductor region 21 and the semiconductor layers 31, 32, and 35.

The peripheral carrier absorbing portion 13 includes the semiconductor region 21 and the semiconductor layers 33 and 35. The peripheral carrier absorbing portion 13 absorbs carriers located at the periphery in the semiconductor layer 33. That is, the semiconductor layer 33 functions as a peripheral carrier absorbing layer that absorbs peripheral carriers. In the present embodiment, the peripheral carrier absorbing portion 13 is a portion of the semiconductor substrate 10 surrounded by edges 13a and 13b of the peripheral carrier absorbing layer when viewed from the direction perpendicular to the main surface 10a. In the present embodiment, the edges 13a and 13b are edges of the semiconductor layer 33. The edge 13b is located closer to the APD 11 than the edge 13a.

The semiconductor region 21 and the semiconductor layers 32, 34, and 35 are the first conductivity type, and the semiconductor layers 31 and 33 are the second conductivity type. Semiconductor impurities are added by, for example, a diffusion method or an ion implantation method. In the present embodiment, the first conductivity type is P type and the second conductivity type is N type. When the semiconductor substrate 10 is an Si-based substrate, a Group 13 element such as B is used as the P-type impurity, and a Group 15 element such as N, P, or As is used as the N-type impurity.

The semiconductor region 21 is located on the main surface 10a side of the semiconductor substrate 10. The semiconductor region 21 forms a part of the main surface 10a. The semiconductor region 21 is, for example, P$^-$ type.

The semiconductor layer 31 forms a part of the main surface 10a. The semiconductor layer 31 is surrounded by the semiconductor region 21 so as to be in contact with the semiconductor region 21 when viewed from the direction perpendicular to the main surface 10a. The semiconductor layer 31 is, for example, N$^+$ type. In the present embodiment, the semiconductor layer 31 forms a cathode in each of the APD 11 and the temperature compensation diode 12.

The semiconductor layer 32 is located between the semiconductor region 21 and the semiconductor layer 31. In other words, the semiconductor layer 32 is in contact with the semiconductor layer 31 on the main surface 10a side and is in contact with the semiconductor region 21 on the main surface 10b side. The semiconductor layer 32 has a higher impurity concentration than the semiconductor region 21. The semiconductor layer 32 is, for example, P type. In the present embodiment, the impurity concentration of the semiconductor layer 32 of the temperature compensation diode 12 is higher than the impurity concentration of the semiconductor layer 32 of the APD 11. The semiconductor layer 32 forms an avalanche region in each of the APD 11 and the temperature compensation diode 12.

The semiconductor layer 33 forms a part of the main surface 10a. The semiconductor layer 33 is surrounded by the semiconductor region 21 so as to be in contact with the semiconductor region 21 when viewed from the direction perpendicular to the main surface 10a. In the present embodiment, the peripheral carrier absorbing portion 13 includes the semiconductor layer 33, and is in contact with only the semiconductor region 21 of the semiconductor substrate 10. The peripheral carrier absorbing portion 13 does not include a layer corresponding to the avalanche region. In the present embodiment, the semiconductor layer 33 has the same impurity concentration as the semiconductor layer 31. The semiconductor layer 33 is, for example, N$^+$ type.

The semiconductor layer 34 forms a part of the main surface 10a. The semiconductor layer 34 is surrounded by the semiconductor region 21 so as to be in contact with the semiconductor region 21 when viewed from the direction perpendicular to the main surface 10a. In the present embodiment, the semiconductor layer 34 has a higher impurity concentration than the semiconductor region 21 and the semiconductor layer 32. The semiconductor layer 34 is, for example, $P^+$ type. The semiconductor layer 34 is connected to the semiconductor layer 35 at a portion that is not illustrated. The semiconductor layer 34 forms an anode of the light detection device 1. The semiconductor layer 34 forms, for example, anodes of the APD 11, the temperature compensation diode 12, and the peripheral carrier absorbing portion 13.

The semiconductor layer 35 is located closer to the main surface 10b of the semiconductor substrate 10 than the semiconductor region 21. The semiconductor layer 35 forms the entire main surface 10b. The semiconductor layer 35 is in contact with the semiconductor region 21 on the main surface 10a side. In the present embodiment, the semiconductor layer 35 has a higher impurity concentration than the semiconductor region 21 and the semiconductor layer 32. The semiconductor layer 35 is, for example, $P^+$ type. The semiconductor layer 35 forms an anode of the light detection device 1. The semiconductor layer 35 forms, for example, anodes of the APD 11, the temperature compensation diode 12, and the peripheral carrier absorbing portion 13.

The light detection device 1 further includes an insulating film 41, electrodes 42, 43, 44, and 45, a passivation film 46, and an antireflection film 47 that are provided on the main surface 10a of the semiconductor substrate 10. The insulating film 41 is stacked on the main surface 10a of the semiconductor substrate 10. The insulating film 41 is, for example, a silicon oxide film. Each of the electrodes 42, 43, 44, and 45 is disposed on the insulating film 41. The passivation film 46 is stacked on the insulating film 41 and the electrodes 42, 43, 44, and 45. The antireflection film 47 is stacked on the main surface 10a of the semiconductor substrate 10.

The electrode 42 penetrates the insulating film 41 to be connected to the semiconductor layer 31 of the APD 11. A part of the electrode 42 is exposed from the passivation film 46 to form a pad electrode 52 of the APD 11. The electrode 42 outputs a signal from the APD 11 at the pad electrode 52. The electrode 43 penetrates the insulating film 41 to be connected to the semiconductor layer 31 of the temperature compensation diode 12. A part of the electrode 43 is exposed from the passivation film 46 to form, for example, a pad electrode 53 of the temperature compensation diode 12.

The electrode 44 penetrates the insulating film 41 to be connected to the semiconductor layer 33 of the peripheral carrier absorbing portion 13. A part of the electrode 44 is exposed from the passivation film 46 to form, for example, a pad electrode 54 of the peripheral carrier absorbing portion 13. The electrode 45 penetrates the insulating film 41 to be connected to the semiconductor layer 34. That is, the electrode 45 is connected to the APD 11, the temperature compensation diode 12, and the peripheral carrier absorbing portion 13. In other words, the APD 11, the temperature compensation diode 12, and the peripheral carrier absorbing portion 13 are connected to the electrode 45 in parallel with each other. A part of the electrode 45 is exposed from the passivation film 46 to form, for example, a pad electrode 55.

In the present embodiment, the pad electrodes 52, 53, 54, 55 are disposed around the APD 11 as illustrated in FIG. 2 when the light detection device 1 is viewed from the direction perpendicular to the main surface 10a. In the present embodiment, the pad electrode 52 is a pad electrode for the cathode of the APD 11. The pad electrode 53 is a pad electrode for the cathode of the temperature compensation diode 12. The pad electrode 54 is a pad electrode for the cathode of the peripheral carrier absorbing portion 13. The pad electrode 55 is a pad electrode for the anodes of the APD 11, the temperature compensation diode 12, and the peripheral carrier absorbing portion 13.

The APD 11, the temperature compensation diode 12, and the peripheral carrier absorbing portion 13 are connected to the pad electrode 55 in parallel with each other. When a reverse bias is applied to the APD 11, the temperature compensation diode 12, and the peripheral carrier absorbing portion 13, a positive voltage is applied to the pad electrode for the cathode, and a negative voltage is applied to the pad electrode for the anode.

The antireflection film 47 is stacked on the semiconductor layer 31 of the APD 11. A part of the antireflection film 47 is exposed from the passivation film 46. Therefore, light transmitted through the antireflection film 47 can enter the semiconductor layer 31 of the APD 11. The semiconductor layer 31 of the temperature compensation diode 12 and the semiconductor layer 33 of the peripheral carrier absorbing portion 13 are covered with the insulating film 41 and are shielded from light. Therefore, when the light detection device 1 is viewed from the main surface 10a side in the direction perpendicular to the main surface 10a, the semiconductor layer 31 of the APD 11 is visible as illustrated in FIG. 2. The semiconductor layer 31 of the temperature compensation diode 12 and the semiconductor layer 33 of the peripheral carrier absorbing portion 13 are not visible.

FIG. 3 is a schematic plan view of the semiconductor substrate 10 viewed from the main surface 10a side in the direction perpendicular to the main surface 10a. As illustrated in FIG. 3, the semiconductor layer 31 of the APD 11 and the semiconductor layer 31 of the temperature compensation diode 12 have a circular shape when viewed from the direction perpendicular to the main surface 10a. The semiconductor layer 33 of the peripheral carrier absorbing portion 13 has an annular shape when viewed from the direction perpendicular to the main surface 10a, and surrounds the semiconductor layer 31 so as to be spaced apart from the semiconductor layer 31 of the APD 11. A part of the semiconductor layer 33 is located between the semiconductor layer 31 of the APD 11 and the semiconductor layer 31 of the temperature compensation diode 12 when viewed from the direction perpendicular to the main surface 10a. In other words, the peripheral carrier absorbing portion 13 is located between the APD 11 and the temperature compensation diode 12 when viewed from the direction perpendicular to the main surface 10a.

When viewed from the direction perpendicular to the main surface 10a, on the line segment connecting the APD 11 and the temperature compensation diode 12 to each other at the shortest distance, the shortest distance between the APD 11 and the peripheral carrier absorbing portion 13 is smaller than the shortest distance between a portion 13c of the peripheral carrier absorbing portion 13 and the temperature compensation diode 12. The portion 13c is a portion, which is closest to the APD 11, of the edges 13a and 13b of the peripheral carrier absorbing portion 13 on the line segment connecting the APD 11 and the temperature compensation diode 12 to each other at the shortest distance. In other words, the portion 13c is a portion, which is closest to the temperature compensation diode 12, of the edge 13b of the peripheral carrier absorbing portion 13 when viewed from the direction perpendicular to the main surface 10a.

More specifically, when viewed from the direction perpendicular to the main surface 10a, the distance L1 is smaller than the distance L2 on the line segment connecting the semiconductor layer 31 of the APD 11 and the semiconductor layer 31 of the temperature compensation diode 12 to each other at the shortest distance. As illustrated in FIGS. 1 and 3, the distance L1 is the shortest distance between the semiconductor layer 31 of the APD 11 and the peripheral carrier absorbing portion 13 when viewed from the direction perpendicular to the main surface 10a. The distance L2 is the shortest distance between the portion 13c of the peripheral carrier absorbing portion 13 and the semiconductor layer 31 of the temperature compensation diode 12 when viewed from the direction perpendicular to the main surface 10a. L2/L1 is, for example, more than 1 and 50 or less. L2/L1 may be 20 or more and 50 or less.

As illustrated in FIG. 1, when viewed from the direction perpendicular to the main surface 10a, the distance L3 is smaller than the distance L4 on the line segment connecting the semiconductor layer 32 of the APD 11 and the semiconductor layer 32 of the temperature compensation diode 12 to each other at the shortest distance. The distance L3 is the shortest distance between the semiconductor layer 32 of the APD 11 and the peripheral carrier absorbing portion 13 when viewed from the direction perpendicular to the main surface 10a. The distance L4 is the shortest distance between the portion 13c of the peripheral carrier absorbing portion 13 and the semiconductor layer 32 of the temperature compensation diode 12 when viewed from the direction perpendicular to the main surface 10a.

Figure 4:
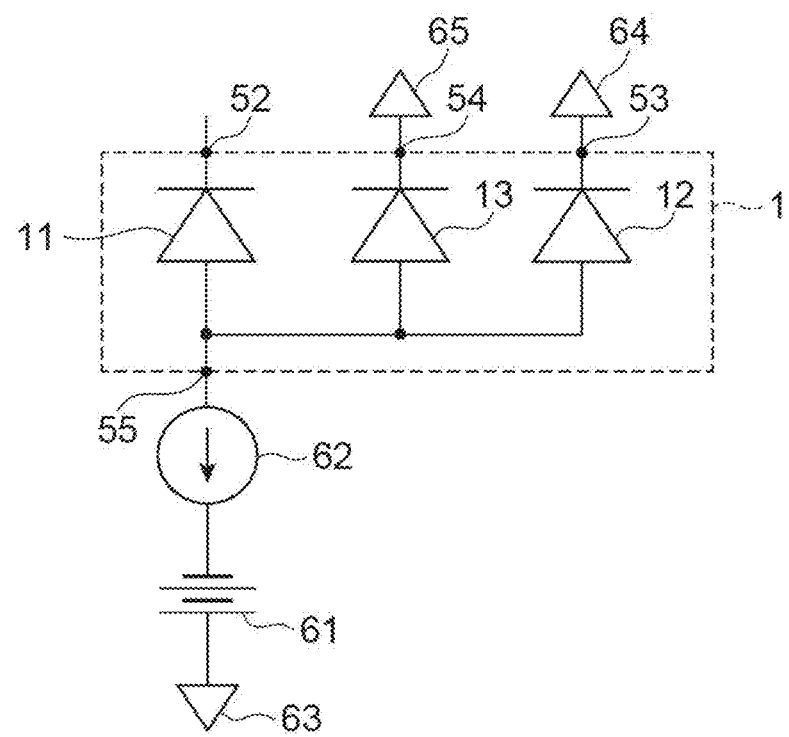
FIG. 4 is a diagram for describing the circuit configuration of the light detection device.

Next, the operation of the light detection device according to the present embodiment will be described with reference to FIG. 4. The light detection device 1 is used in a state in which a power supply 61 and a current limiting circuit 62 are connected to the pad electrode 55. The positive electrode side of the power supply 61 is connected to the ground 63, and the negative electrode side of the power supply 61 is connected to the pad electrode 55 through the current limiting circuit 62. The pad electrodes 53 and 54 are connected to the grounds 64 and 65, respectively. The grounds 64 and 65 may be connected to each other. The pad electrode 52 is connected to a signal reading circuit (not illustrated).

In the present embodiment, the pad electrode 55 is connected to the semiconductor layer 34 of the P+ type, and the semiconductor layer 34 is connected to the semiconductor layer 35 of the P+ type. Therefore, the anodes of the APD 11, the temperature compensation diode 12, and the peripheral carrier absorbing portion 13 are connected to the pad electrode 55 in parallel with each other. As a result, a negative potential is applied to the anodes of the APD 11, the temperature compensation diode 12, and the peripheral carrier absorbing portion 13 by the power supply 61.

The difference between the potential applied to the pad electrode 53 and the potential applied to the pad electrode 55 is a breakdown voltage of the temperature compensation diode 12. Therefore, a potential corresponding to the breakdown voltage applied to the temperature compensation diode 12 is applied to the anode of the APD 11. As a result, a voltage corresponding to the breakdown voltage applied to the temperature compensation diode 12 is applied to the APD 11 as a bias voltage. Similarly, a voltage corresponding to the breakdown voltage applied to the temperature compensation diode 12 is applied to the anode of the peripheral carrier absorbing portion 13 as a bias voltage.

In the present embodiment, since a combination of the power supply 61 and the current limiting circuit 62 is connected to the pad electrode 55, the breakdown voltage of the temperature compensation diode 12 is applied to the pad electrode 55. Therefore, the breakdown voltage of the temperature compensation diode 12 is applied to the APD 11 and the peripheral carrier absorbing portion 13 as a bias voltage. In the present embodiment, the output voltage of the power supply 61 is equal to or higher than the operating voltage of the APD 11. In other words, the output voltage of the power supply 61 is equal to or higher than the upper limit of the temperature fluctuation of the breakdown voltage of the temperature compensation diode 12. For example, the output voltage of the power supply 61 is 300 V or higher. The current limiting circuit 62 is configured to include, for example, a current mirror circuit or a resistor. In this case, for example, the multiplication factor of the APD 11 can be arbitrarily set according to the breakdown voltage difference between the temperature compensation diode 12 and the APD 11. When the amplification factor of the APD 11 is set to an optimal multiplication factor Mopt having a high S/N ratio, the detection accuracy can be improved.

In the present embodiment, the anodes of the APD 11, the temperature compensation diode 12, and the peripheral carrier absorbing portion 13 are integrally formed in the semiconductor layer 35. For example, when the potential applied to the pad electrode 53 is 0 V and the breakdown voltage of the temperature compensation diode 12 is 130 V under an ambient temperature of 25° C., a potential of −130 V is applied to the anode of the APD 11 and the anode of the peripheral carrier absorbing portion 13. Therefore, when the breakdown voltage of the APD 11 is 150 V under an ambient temperature of 25° C., the APD 11 operates in a state in which the potential difference between the anode and the cathode is lower by 20 V than the breakdown voltage.

The APD 11 and the temperature compensation diode 12 have the same temperature characteristics with respect to the relationship between the amplification factor and the bias voltage. Therefore, as long as the temperature compensation diode 12 is in a breakdown state, the APD 11 operates while maintaining the amplification factor when a bias voltage lower by 20 V than the breakdown voltage is applied under an ambient temperature of 25° C. In other words, in the light detection device 1, since a voltage that causes the temperature compensation diode 12 to break down is applied to the temperature compensation diode 12, temperature compensation is provided for the amplification factor of the APD 11.

In the present embodiment, the configuration in which the so-called reach-through type APD 11 operates in a linear mode has been described. The light detection device 1 may have a configuration in which the reach-through type APD 11 arranged to operate in Geiger mode. In the configuration in which the APD 11 arranged to operate in Geiger mode, a quenching resistor is connected to the APD 11. The semiconductor substrate 10 is configured such that the impurity concentration of the semiconductor layer 32 of the temperature compensation diode 12 is lower than the impurity concentration of the semiconductor layer 32 of the APD 11.

Figure 5:
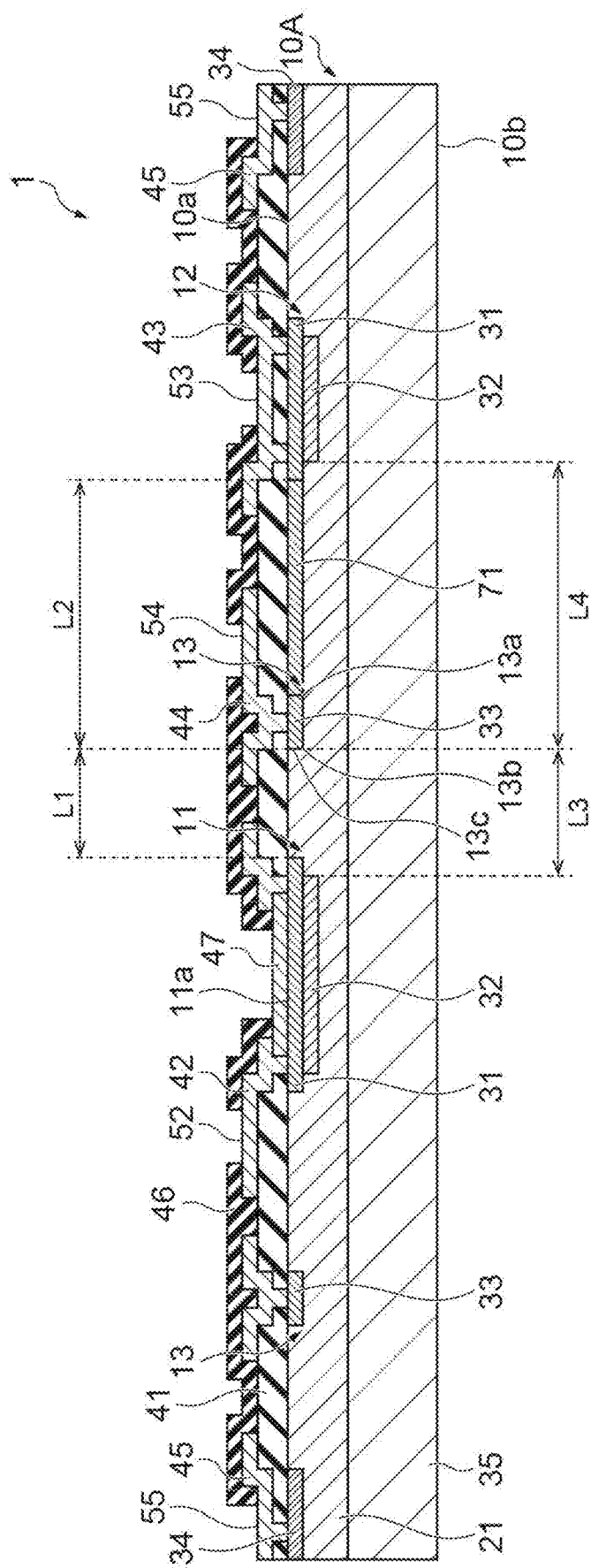
FIG. 5 is a schematic cross-sectional view of a light detection device according to a modification example of the present embodiment.
Figure 6:
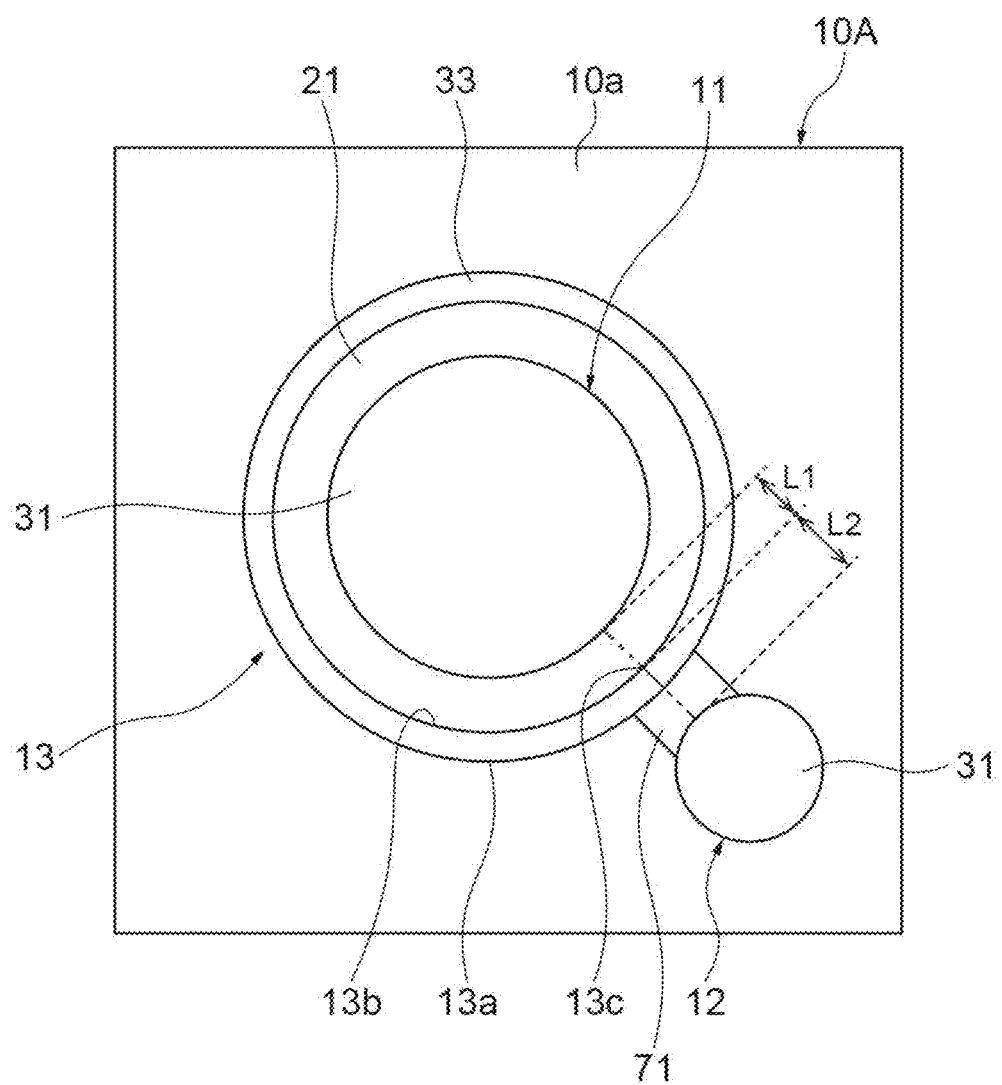
FIG. 6 is a schematic plan view of a semiconductor substrate according to the modification example of the present embodiment.

Next, a light detection device according to a modification example of the present embodiment will be described with reference to FIGS. 5 and 6. FIG. 5 is a schematic cross-sectional view of the light detection device according to the modification example. FIG. 6 is a schematic plan view of a semiconductor substrate illustrated in FIG. 5. This modification example is generally similar to or the same as the above-described embodiment. This modification example is different from the above-described embodiment in that the semiconductor layer 31 of the temperature compensation diode 12 and the semiconductor layer 33 of the peripheral carrier absorbing portion 13 are connected by semiconductor layers of the same conductivity type as the semiconductor layers 31 and 33. Hereinafter, the differences between the above-described embodiment and the modification example will be mainly described.

A semiconductor substrate 10A includes a semiconductor layer 71 that connects the semiconductor layer 31 of the temperature compensation diode 12 and the semiconductor layer 33 of the peripheral carrier absorbing portion 13 to each other. The semiconductor layer 71 has the same conductivity type as the semiconductor layers 31 and 33. In this modification example, the semiconductor layer 71 is the same second conductivity type as the semiconductor layers 31 and 33, and is located at the same height as the semiconductor layers 31 and 33 in the thickness direction of the semiconductor substrate 10. The semiconductor layer 71 is, for example, $N^+$ type.

Also in this modification example, the semiconductor layer 31 of the APD 11 and the semiconductor layer 31 of the temperature compensation diode 12 have a circular shape when viewed from the direction perpendicular to the main surface 10a. The semiconductor layer 33 of the peripheral carrier absorbing portion 13 has an annular shape when viewed from the direction perpendicular to the main surface 10a, and surrounds the semiconductor layer 31 so as to be spaced apart from the semiconductor layer 31 of the APD 11. A part of the semiconductor layer 33 is located between the semiconductor layer 31 of the APD 11 and the semiconductor layer 31 of the temperature compensation diode 12 when viewed from the direction perpendicular to the main surface 10a. In other words, the peripheral carrier absorbing portion 13 is located between the APD 11 and the temperature compensation diode 12 when viewed from the direction perpendicular to the main surface 10a.

The semiconductor layer 71 connects the edge 13a of the peripheral carrier absorbing portion 13 and the semiconductor layer 33 of the temperature compensation diode 12 to each other between the semiconductor layer 31 of the APD 11 and the semiconductor layer 31 of the temperature compensation diode 12 when viewed from the direction perpendicular to the main surface 10a. In the actual semiconductor substrate 10A, the semiconductor layer 71 and the semiconductor layer 31 of the temperature compensation diode 12 are integrated to the extent that the boundary cannot be recognized. Similarly, the semiconductor layer 71 and the semiconductor layer 33 of the peripheral carrier absorbing portion 13 are integrated to the extent that the boundary cannot be recognized.

Figure 7:
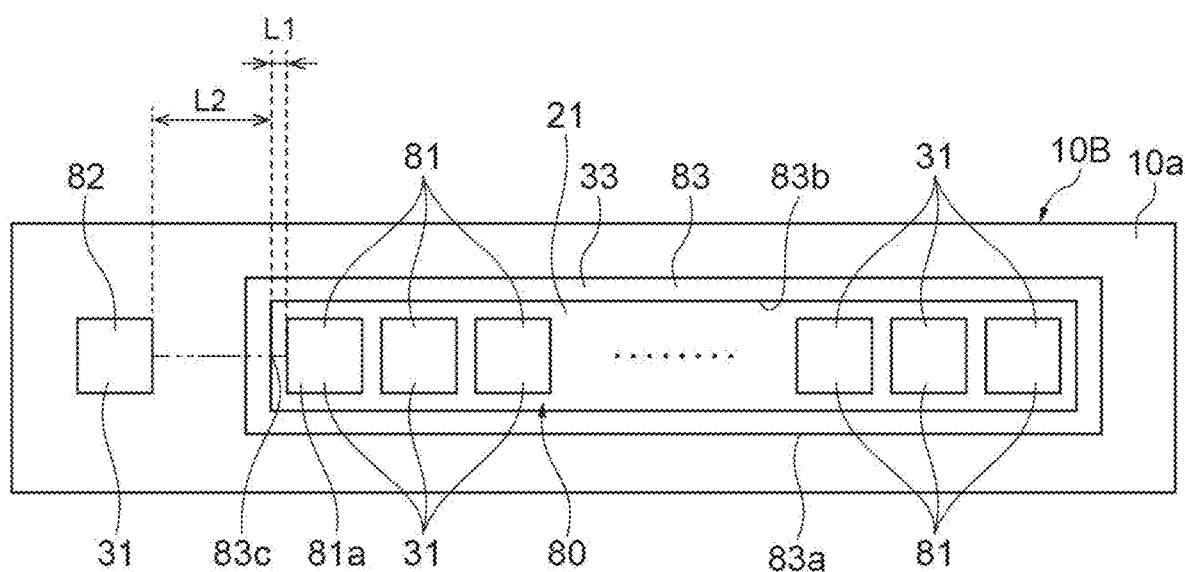
FIG. 7 is a schematic plan view of a semiconductor substrate according to a modification example of the present embodiment.

Next, a light detection device according to another modification example of the present embodiment will be described with reference to FIG. 7. FIG. 7 is a schematic plan view of a semiconductor substrate of the light detection device according to this modification example. This modification example is generally similar to or the same as the above-described embodiment. This modification example is different from the above-described embodiment in that the light detection device includes a semiconductor substrate on which an APD array including a plurality of APDs is formed. Hereinafter, the differences between the above-described embodiment and the modification example will be mainly described.

A semiconductor substrate 10B illustrated in FIG. 7 includes an APD array 80 including a plurality of APDs 81, a temperature compensation diode 82, and a peripheral carrier absorbing portion 83 on the main surface 10a side. The APD array 80 is formed on the semiconductor substrate 10B so as to be spaced apart from the temperature compensation diode 82 and the peripheral carrier absorbing portion 83 when viewed from the direction perpendicular to the main surface 10a. The APDs 81 are formed on the semiconductor substrate 10B so as to be spaced apart from each other when viewed from the direction perpendicular to the main surface 10a.

In the semiconductor substrate 10B, the plurality of APDs 81 and the temperature compensation diodes 82 have rectangular shapes with an equal size, and are arranged in a row in one direction. In the semiconductor substrate 10B, the plurality of APDs 81 are arranged at equal intervals. The temperature compensation diode 82 is located at the end of the array of the plurality of APDs 81 and the temperature compensation diode 82.

The peripheral carrier absorbing portion 83 surrounds the plurality of APDs 81 when viewed from the direction perpendicular to the main surface 10a. A part of the peripheral carrier absorbing portion 83 is located between the APD array 80 and the temperature compensation diode 82 when viewed from the direction perpendicular to the main surface 10a. Specifically, a part of the peripheral carrier absorbing portion 83 is located between the temperature compensation diode 82 and an APD 81a closest to the temperature compensation diode 82, among the plurality of APDs 81, when viewed from the direction perpendicular to the main surface 10a.

Each of the APD 81 and the temperature compensation diode 82 includes a semiconductor region 21 and semiconductor layers 31, 32, and 35, similarly to the APD 11 and the temperature compensation diode 12 in the embodiment described above. The peripheral carrier absorbing portion 83 includes the semiconductor region 21 and the semiconductor layers 33 and 35. The semiconductor layer 33 of the peripheral carrier absorbing portion 83 has an annular shape when viewed from the direction perpendicular to the main surface 10a. The peripheral carrier absorbing portion 83 absorbs carriers located at the periphery in the semiconductor layer 33. That is, the semiconductor layer 33 functions as a peripheral carrier absorbing layer that absorbs peripheral carriers. The peripheral carrier absorbing portion 83 stands for a portion of the semiconductor substrate 10B surrounded by edges 83a and 83b of the peripheral carrier absorbing layer when viewed from the direction perpendicular to the main surface 10a. In this modification example, the edges 83a and 83b are edges of the semiconductor layer 33. The edge 83b is located closer to the APD 81 than the edge 83a.

When viewed from the direction perpendicular to the main surface 10a, on the line segment connecting the APD 81a and the temperature compensation diode 82 to each other at the shortest distance, the shortest distance between the APD 81a and the peripheral carrier absorbing portion 83 is smaller than the shortest distance between a portion 83c of the peripheral carrier absorbing portion 83 and the temperature compensation diode 82. The portion 83c is a portion, which is closest to the APD 81a, of the edges 83a and 83b of the peripheral carrier absorbing portion 83 on the line segment connecting the APD 81a and the temperature compensation diode 82 to each other at the shortest distance. In other words, the portion 83c is a portion, which is closest to the temperature compensation diode 82, of the edge 83b of the peripheral carrier absorbing portion 83 when viewed from the direction perpendicular to the main surface 10a.

More specifically, similarly to the semiconductor substrate 10, when viewed from the direction perpendicular to the main surface 10a, the distance L1 is smaller than the distance L2 on the line segment connecting the semiconductor layer 31 of the APD 81a and the semiconductor layer 31 of the temperature compensation diode 82 to each other at the shortest distance. In the semiconductor substrate 10B, the distance L1 is the shortest distance between the semiconductor layer 31 of the APD 81a and the peripheral carrier absorbing portion 83 when viewed from the direction perpendicular to the main surface 10a. The distance L2 is the shortest distance between the portion 83c of the peripheral carrier absorbing portion 83 and the semiconductor layer 31 of the temperature compensation diode 82 when viewed from the direction perpendicular to the main surface 10a. L2/L1 is, for example, more than 1 and 50 or less. L2/L1 may be 20 or more and 50 or less.

Similarly to the semiconductor substrate 10, when viewed from the direction perpendicular to the main surface 10a, the distance L3 is smaller than the distance L4 on the line segment connecting the semiconductor layer 32 of the APD 81a and the semiconductor layer 32 of the temperature compensation diode 82 to each other at the shortest distance. In the semiconductor substrate 10B, the distance L3 is the shortest distance between the semiconductor layer 32 of the APD 81a and the peripheral carrier absorbing portion 83 when viewed from the direction perpendicular to the main surface 10a. The distance L4 is the shortest distance between the portion 83c of the peripheral carrier absorbing portion 83 and the semiconductor layer 32 of the temperature compensation diode 82 when viewed from the direction perpendicular to the main surface 10a.

Figure 8:
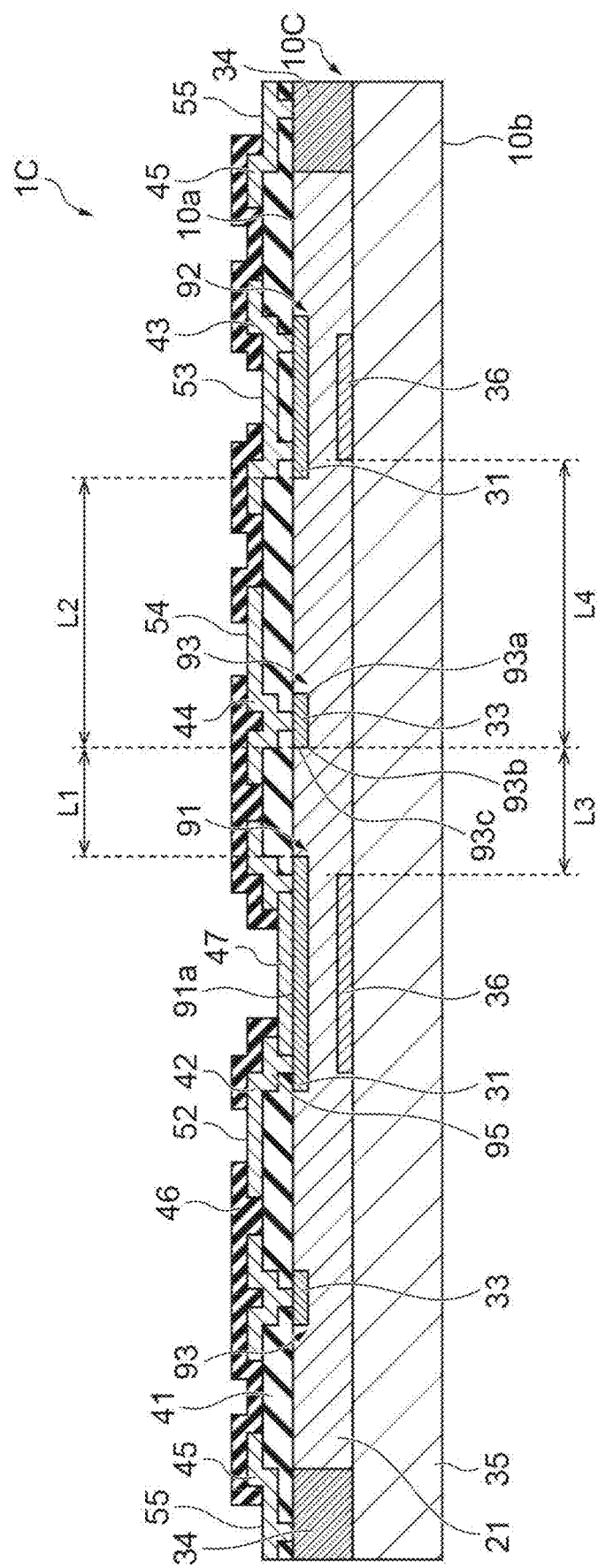
FIG. 8 is a schematic cross-sectional view of a light detection device according to a modification example of the present embodiment.

Next, a light detection device according to another modification example of the present embodiment will be described with reference to FIG. 8. FIG. 8 is a schematic cross-sectional view of the light detection device according to the modification example. This modification example is generally similar to or the same as the above-described embodiment. This modification example is different from the above-described embodiment in that a so-called reverse type APD is formed on the semiconductor substrate of the light detection device and that the APD on the semiconductor substrate is arranged to operate in Geiger mode. The semiconductor substrate 10 illustrated in FIG. 1 has a so-called reach-through type APD, and the APD operates in the linear mode. On the other hand, a semiconductor substrate 10C of a light detection device 1C according to this modification example has a so-called reverse type APD, and the APD is arranged to operate in Geiger mode. Hereinafter, the differences between the above-described embodiment and the modification example will be mainly described.

The semiconductor substrate 10C includes an APD 91, a temperature compensation diode 92, and a peripheral carrier absorbing portion 93 respectively corresponding to the APD 11, the temperature compensation diode 12, and the peripheral carrier absorbing portion 13 of the semiconductor substrate 10. The APD 91 has a light incidence surface 91a corresponding to the light incidence surface 11a of the APD 11 on the main surface 10a side. The semiconductor substrate 10C includes a semiconductor region 21 and semiconductor layers 31, 33, 34, 35, and 36. The semiconductor substrate 10C is different from the semiconductor substrate 10 in that the semiconductor layer 36 is provided instead of the semiconductor layer 32. Each of the APD 91 and the temperature compensation diode 92 includes the semiconductor region 21 and the semiconductor layers 31, 35, and 36. As illustrated in FIG. 8, the semiconductor layer 34 is in contact with the semiconductor layer 35.

The peripheral carrier absorbing portion 93 includes the semiconductor region 21 and the semiconductor layers 33 and 35. The peripheral carrier absorbing portion 93 absorbs carriers located at the periphery in the semiconductor layer 33. That is, the semiconductor layer 33 functions as a peripheral carrier absorbing layer that absorbs peripheral carriers. In this modification example, the peripheral carrier absorbing portion 93 is a portion of the semiconductor substrate 10C surrounded by edges 93a and 93b of the peripheral carrier absorbing layer when viewed from the direction perpendicular to the main surface 10a. In the present embodiment, the edges 93a and 93b are edges of the semiconductor layer 33. The edge 93b is located closer to the APD 91 than the edge 93a.

In the semiconductor substrate 10C, the semiconductor layer 36 is located between the semiconductor region 21 and the semiconductor layer 35. In other words, the semiconductor layer 36 is in contact with the semiconductor region 21 on the main surface 10a side and is in contact with the semiconductor layer 35 on the main surface 10b side. In this modification example, the impurity concentration of the semiconductor layer 36 of the temperature compensation diode 92 is lower than the impurity concentration of the semiconductor layer 36 of the APD 91.

In the semiconductor substrate 10C, the semiconductor region 21 and the semiconductor layers 31, 33, and 36 are the first conductivity type, and the semiconductor layers 34, and 35 are the second conductivity type. Also in this modification example, the first conductivity type is P type and the second conductivity type is N type. When the semiconductor substrate 10C is an Si-based substrate, a Group 13 element such as B is used as the P-type impurity, and a Group 15 element such as N, P, or As is used as the N-type impurity.

In the semiconductor substrate 10C, the semiconductor layers 31 and 33 have a higher impurity concentration than the semiconductor region 21. The semiconductor layer 36 has a higher impurity concentration than the semiconductor region 21, and has a lower impurity concentration than the semiconductor layers 31 and 33. Specifically, the semiconductor region 21 is, for example, $P^-$ type, the semiconductor layers 31 and 33 are, for example, $P^+$ type, and the semiconductor layer 36 is, for example, P type. In this modification example, the semiconductor layer 31 forms an anode in each of the APD 91 and the temperature compensation diode 92.

In the semiconductor substrate 10C, the semiconductor layer 34 has the same impurity concentration as the semiconductor layer 35. The semiconductor layers 34 and 35 are, for example, $N^+$ type. The semiconductor layers 34 and 35 form the cathode of the light detection device 1C. The semiconductor layers 34 and 35 form, for example, cathodes of the APD 91, the temperature compensation diode 92, and the peripheral carrier absorbing portion 93.

In this modification example, a quenching resistor 95 is provided in a part of the electrode 42. The quenching resistor 95 is electrically connected to the semiconductor layer 31 of the $P^+$ type in the APD 91. The quenching resistor 95 is electrically connected to the pad electrode 52 on a side opposite to the semiconductor layer 31. In this modification example, the pad electrode 52 is a pad electrode for the anode of the APD 91. The pad electrode 53 is a pad electrode for the anode of the temperature compensation diode 92. The pad electrode 54 is a pad electrode for the anode of the peripheral carrier absorbing portion 93. The pad electrode 55 is a pad electrode for the cathodes of the APD 91, the temperature compensation diode 92, and the peripheral carrier absorbing portion 93.

The APD 91, the temperature compensation diode 92, and the peripheral carrier absorbing portion 93 are connected to the pad electrode 55 in parallel with each other. When a reverse bias is applied to the APD 91, the temperature compensation diode 92, and the peripheral carrier absorbing portion 93, a positive voltage is applied to the pad electrode for the anode, and a negative voltage is applied to the pad electrode for the cathode.

When viewed from the direction perpendicular to the main surface 10a, on the line segment connecting the APD 91 and the temperature compensation diode 92 to each other at the shortest distance, the shortest distance between the APD 91 and the peripheral carrier absorbing portion 93 is smaller than the shortest distance between a portion 93c of the peripheral carrier absorbing portion 93 and the temperature compensation diode 92. The portion 93c is a portion, which is closest to the APD 91, of the edges 93a and 93b of the peripheral carrier absorbing portion 93 on the line segment connecting the APD 91 and the temperature compensation diode 92 to each other at the shortest distance. In other words, the portion 93c is a portion, which is closest to the temperature compensation diode 92, of the edge 93b of the peripheral carrier absorbing portion 93 when viewed from the direction perpendicular to the main surface 10a.

More specifically, when viewed from the direction perpendicular to the main surface 10a, the distance L1 is smaller than the distance L2 on the line segment connecting the semiconductor layer 31 of the APD 91 and the semiconductor layer 31 of the temperature compensation diode 92 to each other at the shortest distance. The distance L1 is the shortest distance between the semiconductor layer 31 of the APD 91 and the peripheral carrier absorbing portion 93 when viewed from the direction perpendicular to the main surface 10a. The distance L2 is the shortest distance between the portion 93c of the peripheral carrier absorbing portion 93 and the semiconductor layer 31 of the temperature compensation diode 92 when viewed from the direction perpendicular to the main surface 10a. L2/L1 is, for example, more than 1 and 50 or less. L2/L1 may be 20 or more and 50 or less.

As illustrated in FIG. 8, when viewed from the direction perpendicular to the main surface 10a, the distance L3 is smaller than the distance L4 on the line segment connecting the semiconductor layer 36 of the APD 91 and the semiconductor layer 36 of the temperature compensation diode 92 to each other at the shortest distance. The distance L3 is the shortest distance between the semiconductor layer 36 of the APD 91 and the peripheral carrier absorbing portion 93 when viewed from the direction perpendicular to the main surface 10a. The distance L4 is the shortest distance between the portion 93c of the peripheral carrier absorbing portion 93 and the semiconductor layer 36 of the temperature compensation diode 92 when viewed from the direction perpendicular to the main surface 10a.

Figure 9:
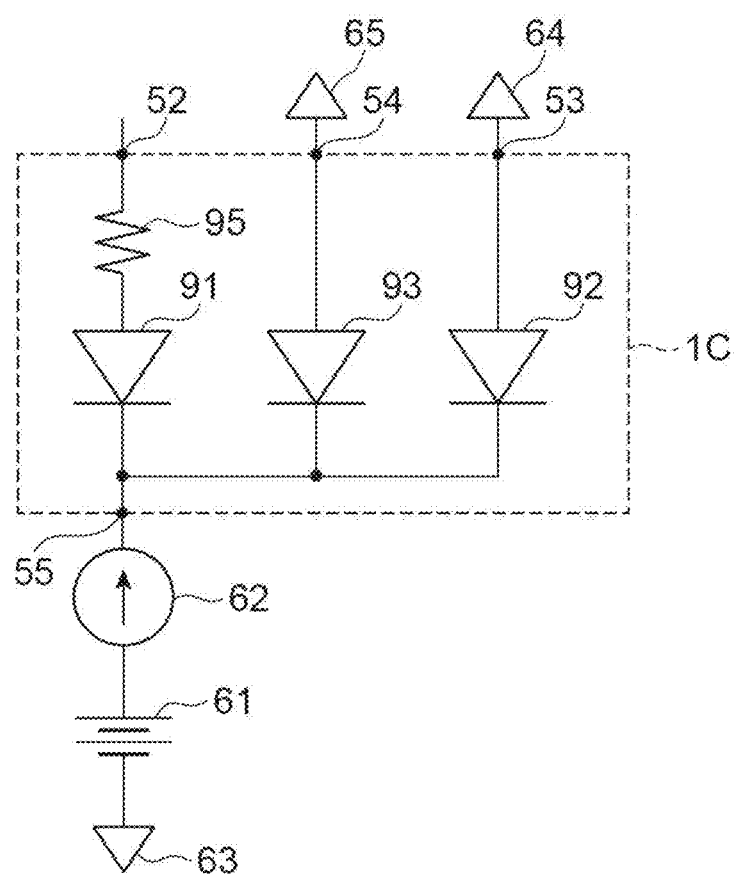
FIG. 9 is a diagram for describing the circuit configuration of the light detection device according to the modification example of the present embodiment.

Next, the operation of a light detection device including the semiconductor substrate 10C will be described with reference to FIG. 9. Similarly to the light detection device 1, the light detection device 1C is used in a state in which the power supply 61 and the current limiting circuit 62 are connected to the pad electrode 55. In the light detection device 1C, the negative electrode side of the power supply 61 is connected to the ground 63, and the positive electrode side of the power supply 61 is connected to the pad electrode 55 through the current limiting circuit 62. The pad electrodes 53 and 54 are connected to the grounds 64 and 65, respectively. The grounds 64 and 65 may be connected to each other. The pad electrode 52 is connected to a signal reading circuit (not illustrated).

In this modification example, the pad electrode 55 is connected to the semiconductor layer 34 of the N$^+$ type, and the semiconductor layer 34 is connected to the semiconductor layer 35 of the N$^+$ type. Therefore, the cathodes of the APD 91, the temperature compensation diode 92, and the peripheral carrier absorbing portion 93 are connected to the pad electrode 55 in parallel with each other. As a result, a positive potential is applied to the cathodes of the APD 91, the temperature compensation diode 92, and the peripheral carrier absorbing portion 93 by the power supply 61.

The difference between the potential applied to the pad electrode 53 and the potential applied to the pad electrode 55 is a breakdown voltage of the temperature compensation diode 92. Therefore, a potential corresponding to the breakdown voltage applied to the temperature compensation diode 92 is applied to the cathode of the APD 91. As a result, a voltage corresponding to the breakdown voltage applied to the temperature compensation diode 92 is applied to the APD 91 as a bias voltage. Similarly, a voltage corresponding to the breakdown voltage applied to the temperature compensation diode 92 is applied to the cathode of the peripheral carrier absorbing portion 93 as a bias voltage.

In this modification example, since a combination of the power supply 61 and the current limiting circuit 62 is connected to the pad electrode 55, the breakdown voltage of the temperature compensation diode 92 is applied to the pad electrode 55. Therefore, the breakdown voltage of the temperature compensation diode 92 is applied to the APD 91 and the peripheral carrier absorbing portion 93 as a bias voltage. In this modification example, the output voltage of the power supply 61 is equal to or higher than the operating voltage of the APD 91. In other words, the output voltage of the power supply 61 is equal to or higher than the upper limit of the temperature fluctuation of the breakdown voltage of the temperature compensation diode 92. For example, the output voltage of the power supply 61 is 300 V or higher. The current limiting circuit 62 is configured to include, for example, a current mirror circuit or a resistor. In this case, for example, the multiplication factor of the APD 91 can be arbitrarily set according to the breakdown voltage difference between the temperature compensation diode 92 and the APD 91. When the amplification factor of the APD 91 is set to the optimal multiplication factor Mopt having a high S/N ratio, the detection accuracy can be improved.

In this modification example, the cathodes of the APD 91, the temperature compensation diode 92, and the peripheral carrier absorbing portion 93 are integrally formed in the semiconductor layer 35. For example, when the potential applied to the pad electrode 53 is 0 V and the breakdown voltage of the temperature compensation diode 12 is 50 V under an ambient temperature of 25° C., a potential of +50 V is applied to the cathode of the APD 91 and the cathode of the peripheral carrier absorbing portion 13. When the breakdown voltage of the APD 91 is 48 V under an ambient temperature of 25° C., the APD 91 operates in a state in which the potential difference between the anode and the cathode is higher by 2V than the breakdown voltage.

The APD 91 and the temperature compensation diode 92 have the same temperature characteristics with respect to the relationship between the amplification factor and the bias voltage. Therefore, as long as the temperature compensation diode 92 is in a breakdown state, the APD 91 operates while maintaining the amplification factor when a bias voltage higher by 2 V than the breakdown voltage is applied under an ambient temperature of 25° C. In other words, in the light detection device 1C, since a voltage that causes the temperature compensation diode 92 to break down is applied to the temperature compensation diode 92, temperature compensation is provided for the amplification factor of the APD 91.

In this modification example, the configuration in which the so-called reverse type APD 91 is arranged to operate in Geiger mode has been described. The light detection device 1C may have a configuration in which the reverse type APD 91 operates in the linear mode. In the configuration in which the APD 91 operates in the linear mode, the quenching resistor 95 is not required. The semiconductor substrate 10C is configured such that the impurity concentration of the semiconductor layer 36 of the temperature compensation diode 92 is higher than the impurity concentration of the semiconductor layer 36 of the APD 91.

Next, the operational effects of the light detection devices in the above-described embodiment and modification examples will be described. Conventionally, when manufacturing a light detection device including an APD and a temperature compensation diode having the same temperature characteristics, it has been necessary to select and combine APDs having desired temperature characteristics with respect to the relationship between the amplification factor and the bias voltage. For this reason, it has been difficult to reduce the cost. In this regard, in the light detection devices 1 and 1C, the APDs 11, 81, and 91 and the temperature compensation diodes 12, 82, and 92 are formed on the same semiconductor substrates 10, 10A, 10B, and 10C, respectively. In this case, the temperature compensation diodes 12, 82, and 92 and the APDs 11, 81, and 91 having the same temperature characteristics over a wide temperature range with respect to the amplification factor and the bias voltage are formed more easily and accurately than in a case where the temperature compensation diodes 12, 82, and 92 and the APDs 11, 81, and 91 are formed on different semiconductor substrates. Therefore, temperature compensation can be ensured for the multiplication factor while suppressing the manufacturing cost.

When a breakdown voltage is applied to the temperature compensation diodes 12, 82, and 92, the temperature compensation diodes 12, 82, and 92 may emit light. When the temperature compensation diodes 12, 82, and 92 emit light, carriers are generated in the semiconductor substrate due to the light emitted from the temperature compensation diodes 12, 82, and 92. Therefore, in a state in which the temperature compensation diodes 12, 82, and 92 and the APDs 11, 81, and 91 are formed on the same semiconductor substrate, the carriers may affect the detection results of the APDs 11, 81, and 91.

In the light detection devices 1 and 1C described above, the peripheral carrier absorbing portions 13, 83, and 93 are located between the APDs 11, 81, and 91 and the temperature compensation diodes 12, 82, and 92. When viewed from the direction perpendicular to the main surface 10a, on the line segments connecting the APDs 11, 81, and 91 and the temperature compensation diodes 12, 82, and 92 to each other at the shortest distance, the shortest distances between the APDs 11, 81, and 91 and the peripheral carrier absorbing portions 13, 83, and 93 are smaller than the shortest distances between the portions 13c, 83c, and 93c of the peripheral carrier absorbing portions 13, 83, and 93 and the temperature compensation diodes 12, 82, and 92.

More specifically, when viewed from the direction perpendicular to the main surface 10a, on the line segments connecting the APDs 11, 81, and 91 and the temperature compensation diodes 12, 82, and 92 to each other at the shortest distance, the distances L1 between the semiconductor layers 31 of the APDs 11, 81, and 91 and the peripheral carrier absorbing portions 13, 83, and 93 are smaller than the distances L2 between the portions 13c, 83c, and 93c of the peripheral carrier absorbing portions 13, 83, and 93 and the semiconductor layers 31 of the temperature compensation diodes 12, 82, and 92. In the light detection device 1, when viewed from the direction perpendicular to the main surface 10a, on the line segments connecting the APDs 11 and 81 and the temperature compensation diodes 12 and 82 to each other at the shortest distance, the distances L3 between the semiconductor layers 32 of the APDs 11 and 81 and the peripheral carrier absorbing portions 13 and 83 are smaller than the distances L4 between the portions 13c and 83c of the peripheral carrier absorbing portions 13 and 83 and the semiconductor layers 32 of the temperature compensation diodes 12 and 82. In the light detection device 1C, when viewed from the direction perpendicular to the main surface 10a, on the line segment connecting the APD 91 and the temperature compensation diode 92 to each other at the shortest distance, the distance L3 between the semiconductor layer 36 of the APD 91 and the peripheral carrier absorbing portions 93 is smaller than the distance L4 between the portion 93c of the peripheral carrier absorbing portion 93 and the semiconductor layer 36 of the temperature compensation diode 92.

In the configuration described above, the carriers generated due to the light emission of the temperature compensation diodes 12, 82, and 92 are absorbed at the peripheral carrier absorbing portions 13, 83, and 93 before reaching the APDs 11, 81, and 91. As a result, the carriers due to the temperature compensation diodes 12, 82, and 92 are suppressed from reaching the APDs 11, 81, and 91, enabling improvement of the detection accuracy. Therefore, in the light detection devices 1 and 1C, temperature compensation is ensured for the multiplication factor while suppressing the manufacturing cost, enabling improvement of the detection accuracy. L2/L1 is, for example, more than 1 and 50 or less. L2/L1 may be 20 or more and 50 or less, and in this case, the carriers due to the temperature compensation diodes 12, 82, and 92 are further suppressed from reaching the APDs 11, 81, and 91.

The light detection devices 1 and 1C include the electrodes 42, 43, 44, and 45. The electrode 42 is connected to the APDs 11, 81, and 91 and is configured to output signals from the APDs 11, 81, and 91. The electrode 43 is connected to the temperature compensation diodes 12, 82, and 92, and the electrode 44 is connected to the peripheral carrier absorbing portions 13, 83, and 93. Therefore, a desired potential can be applied to each of the APDs 11, 81, and 91, the temperature compensation diodes 12, 82, and 92, and the peripheral carrier absorbing portions 13, 83, and 93. When a voltage is applied to the peripheral carrier absorbing portions 13, 83, and 93, the carriers generated in the temperature compensation diodes 12, 82, and 92 can be further absorbed.

The APDs 11, 81, and 91, the temperature compensation diodes 12, 82, and 92, and the peripheral carrier absorbing portions 13, 83, and 93 are connected to the electrode 45 in parallel with each other. Since the APDs 11, 81, and 91 and the temperature compensation diodes 12, 82, and 92 are connected in parallel to each other, potentials corresponding to the breakdown voltages of the temperature compensation diodes 12, 82, and 92 can be applied to the APDs 11, 81, and 91. Since the peripheral carrier absorbing portions 13, 83, and 93 are also connected in parallel to the APDs 11, 81, and 91 and the temperature compensation diodes 12, 82, and 92, a potential can be applied to the peripheral carrier absorbing portions 13, 83, and 93 without providing a separate power supply. When a voltage is applied to the peripheral carrier absorbing portions 13, 83, and 93, the carriers generated in the temperature compensation diodes 12, 82, and 92 can be further absorbed.

Each of the semiconductor substrates 10, 10A, and 10B includes the semiconductor region 21 of the first conductivity type. Each of the APDs 11 and 81 and the temperature compensation diodes 12 and 82 includes the semiconductor layer 31 and the semiconductor layer 32. In the semiconductor substrates 10, 10A, and 10B, the semiconductor layer 31 is a second conductivity type. The semiconductor layer 32 is a first conductivity type having a higher impurity concentration than the semiconductor region 21. The semiconductor layer 32 is located between the semiconductor region 21 and the semiconductor layer 31. As described above, the temperature compensation diodes 12 and 82 have the same configuration as the APDs 11 and 81. Therefore, it is possible to easily form the temperature compensation diodes 12 and 82 whose temperature characteristics with respect to the amplification factor and the bias voltage are very similar to those of the APDs 11 and 81.

In the semiconductor substrates 10, 10A, and 10B including the reach-through type APDs 11 and 81, respectively, each of the peripheral carrier absorbing portions 13 and 83 includes the semiconductor layer 33 of the second conductivity type. Therefore, the carriers generated in the temperature compensation diodes 12 and 82 can be further absorbed at the peripheral carrier absorbing portions 13 and 83.

The semiconductor substrate 10C includes the semiconductor region 21 of the first conductivity type. Each of the APD 91 and the temperature compensation diode 92 includes the semiconductor layer 35 and the semiconductor layer 36. In the semiconductor substrate 10C, the semiconductor layer 35 is a second conductivity type. The semiconductor layer 36 is a first conductivity type having a higher impurity concentration than the semiconductor region 21. The semiconductor layer 36 is located between the semiconductor region 21 and the semiconductor layer 35. As described above, the temperature compensation diode 92 has the same configuration as the APD 91. Therefore, it is possible to easily form the temperature compensation diode 92 whose temperature characteristics with respect to the amplification factor and the bias voltage are very similar to those of the APD 91.

In the semiconductor substrate 10C including the reverse type APD 91, the peripheral carrier absorbing portion 93 includes the semiconductor layer 33 of the first conductivity type. Therefore, the carriers generated in the temperature compensation diode 92 can be further absorbed at the peripheral carrier absorbing portion 93.

In the semiconductor substrates 10, 10A, and 10B, the impurity concentration in the semiconductor layer 32 of each of the temperature compensation diodes 12 and 82 is higher than the impurity concentration in the semiconductor layer 32 of each of the APDs 11 and 81. In this case, in the light detection device 1, for example, the breakdown voltage of each of the APDs 11 and 81 is higher than the breakdown voltage of each of the temperature compensation diodes 12 and 82. As a result, temperature compensation is ensured for the multiplication factors of the APDs 11 and 81 operating in the linear mode. In addition, when the APD 91 of the semiconductor substrate 10C is operated in the linear mode, the semiconductor substrate 10C is configured such that the impurity concentration in the semiconductor layer 36 of the temperature compensation diode 92 is higher than the impurity concentration in the semiconductor layer 36 of the APD 91. In this case, in the light detection device 1C, for example, the breakdown voltage of the APD 91 is higher than the breakdown voltage of the temperature compensation diode 92.

In the semiconductor substrate 10C, the impurity concentration in the semiconductor layer 36 of the temperature compensation diode 92 is lower than the impurity concentration in the semiconductor layer 36 of the APD 91. In this case, in the light detection device 1C, for example, the breakdown voltage of the APD 91 may be lower than the breakdown voltage of the temperature compensation diode 92. As a result, temperature compensation can be ensured for the multiplication factor of the APD 91 arranged to operate in Geiger mode. In addition, when the APDs 11 and 81 of the semiconductor substrates 10, 10A, and 10B are arranged to operate in Geiger mode, the semiconductor substrates 10, 10A, and 10B are configured such that the impurity concentration in the semiconductor layer 32 of each of the temperature compensation diodes 12 and 82 is lower than the impurity concentration in the semiconductor layer 32 of each of the APDs 11 and 81. In this case, in the light detection device 1, for example, the breakdown voltages of the APDs 11 and 81 are lower than the breakdown voltages of the temperature compensation diodes 12 and 82.

Figure 10:
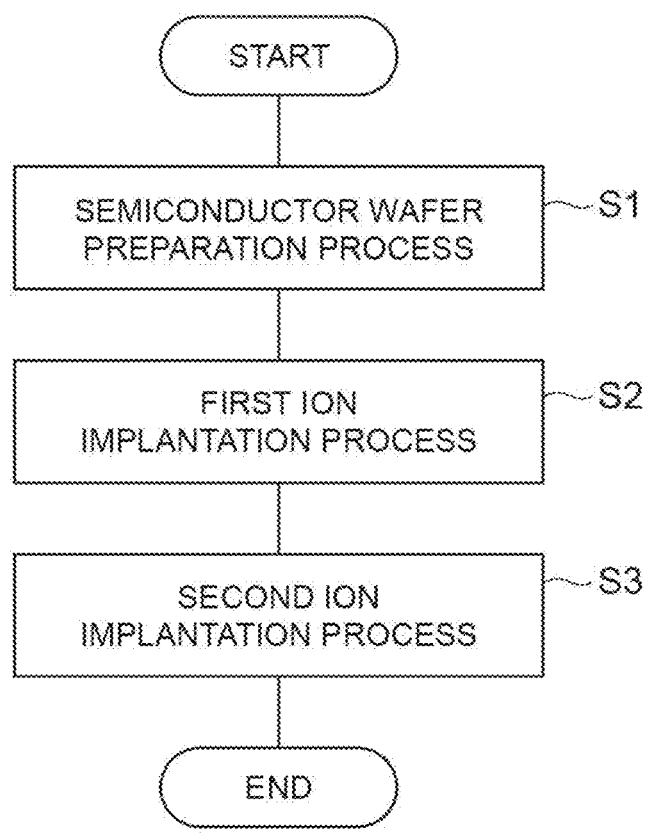
FIG. 10 is a flowchart for describing a method for manufacturing a semiconductor substrate.

Next, an example of a method for manufacturing a light detection device will be described with reference to FIG. 10. FIG. 10 is a flowchart illustrating a method for manufacturing the semiconductor substrate 10 in the light detection device 1.

First, a semiconductor wafer is prepared (step S1). The semiconductor wafer is a substrate before being processed as the semiconductor substrate 10, and has main surfaces 10a and 10b facing each other. The semiconductor wafer has a semiconductor region of the first conductivity type corresponding to the semiconductor region 21. The semiconductor region is provided on the main surface 10a side of the semiconductor wafer, and forms the entire main surface 10a. For example, the semiconductor region of the semiconductor wafer is P⁻ type. In the present embodiment, the semiconductor layer 35 of the first conductivity type having an impurity concentration higher than the semiconductor region of the semiconductor wafer is formed in the semiconductor wafer by adding impurities from the main surface 10b side. For example, the semiconductor layer 35 is P⁺ type.

Subsequently, as first ion implantation process (step S2), impurity ions are implanted to the main surface 10a side using an ion implantation method to add impurities, forming the semiconductor layers 31 and 33 of the second conductivity type and the semiconductor layers 32 and 34 of the first conductivity type. For example, the semiconductor layers 31 and 33 are N⁺ type, the semiconductor layer 32 is P type, and the semiconductor layer 34 is P⁺ type. In the present embodiment, the semiconductor layer 31 and the semiconductor layer 33 are formed by implanting second conductivity type impurity ions into different portions spaced apart from each other in one ion implantation process. The semiconductor layer 32 is formed by implanting first conductivity type impurity ions after the semiconductor layers 31 and 33 are formed. The semiconductor layer 32 may be formed by implanting first conductivity type impurity ions before the semiconductor layers 31 and 33 are formed.

The semiconductor layers 31 and 32 are formed at locations overlapping each other when viewed from the direction perpendicular to the main surface 10a. The semiconductor layer 32 is formed by implanting first conductivity type impurities at a location deeper than the semiconductor layer 31 when viewed from the main surface 10a side. The semiconductor layers 31 and 32 are formed in a plurality of portions, which are spaced apart from each other when viewed from the direction perpendicular to the main surface 10a, in a region serving as one semiconductor substrate 10. The plurality of portions include a portion where the APD 11 is disposed and a portion where the temperature compensation diode 12 is disposed. In the first ion implantation process, second conductivity type impurities are added to each portion so that the impurity concentration of the semiconductor layer 31 is equal to each other. Similarly, first conductivity type impurities are added to each portion so that the impurity concentration of the semiconductor layer 32 is equal to each other.

Subsequently, as second ion implantation process (step S3), impurities are further added to the semiconductor layer 32 only in some of the above-described plurality of portions using an ion implantation method. In the present embodiment, the first conductivity type impurities are further implanted into the semiconductor layer 32 only in a portion where the temperature compensation diode 12 is disposed. For this reason, in the light detection device 1, the impurity concentration in the semiconductor layer 32 of the temperature compensation diode 12 is higher than the impurity concentration in the semiconductor layer 32 of the APD 11. In this case, the light detection device 1 is configured such that the breakdown voltage of the APD 11 is higher than the breakdown voltage of the temperature compensation diode 12.

In the second ion implantation process, the first conductivity type impurities may be further implanted into the semiconductor layer 32 only in a portion where the APD 11 is disposed, not in a portion where the temperature compensation diode 12 is disposed. In this case, in the light detection device 1, the impurity concentration in the semiconductor layer 32 of the temperature compensation diode 12 is lower than the impurity concentration in the semiconductor layer 32 of the APD 11. The light detection device in this case is configured such that the breakdown voltage of the APD 11 is lower than the breakdown voltage of the temperature compensation diode 12.

By the processes described above, the semiconductor substrate 10 of the light detection device 1 is formed. In the present embodiment, the semiconductor layers 31, 32, 33, and 34 are formed from the state in which the semiconductor layer 35 has already been formed. However, the semiconductor layer 35 may be formed after the semiconductor layers 31, 32, 33, and 34 are formed.

In the manufacturing method described above, the semiconductor layer 31 and the semiconductor layer 32 are formed in each portion by implanting ions into a plurality of different portions. Thereafter, ions are further implanted into the semiconductor layer 32 in some of the portions. Therefore, the temperature compensation diode 12 and the APD 11 each of which is set to the desired breakdown voltage can be easily manufactured while having the same temperature characteristics with respect to the multiplication factor and the bias voltage. In this case, for example, the multiplication factor of the APD 11 can be arbitrarily set according to the breakdown voltage difference between the temperature compensation diode 12 and the APD 11. Therefore, when each of the temperature compensation diode 12 and the APD 11 is set to the desired breakdown voltage, the detection accuracy can be improved. For example, when the multiplication factor of the APD 11 is set to the optimal multiplication factor Mopt having a high S/N ratio according to the breakdown voltage difference between the temperature compensation diode 12 and the APD 11, the detection accuracy can be improved. Thus, in the manufacturing method described above, temperature compensation is ensured for the multiplication factor while suppressing the manufacturing cost, enabling improvement of the detection accuracy.

In the present embodiment, in the first ion implantation process, the semiconductor layer 31 and the semiconductor layer 33 are formed by one ion implantation process. For this reason, the peripheral carrier absorbing portion 13 is formed without increasing the number of ion implantation processes. Therefore, the manufacturing cost is reduced.

While the embodiment of the present invention and the modification examples have been described above, the present invention is not necessarily limited to the embodiment and the modification examples described above, and various changes can be made without departing from the scope of the present invention.

For example, the manufacturing method described above can be applied not only to the manufacturing of the semiconductor substrate 10 of the light detection device 1 but also to the manufacturing of the semiconductor substrates 10A and 10B. The manufacturing method described above can be applied not only to the manufacturing of the light detection device 1 but also to the manufacturing of the light detection device 1C.

In the present embodiment and the modification examples, the configuration in which the peripheral carrier absorbing portion 13 is formed in a ring shape has been described, but the present invention is not limited thereto. The peripheral carrier absorbing portion 13 does not have to completely surround the APD 11 or the APD array 80. In other words, the peripheral carrier absorbing portion 13 does not have to surround the APD 11 or the APD array 80 by 360° when viewed from the direction perpendicular to the main surface 10a. For example, the peripheral carrier absorbing portion 13 may have an I shape or a U shape as long as the peripheral carrier absorbing portion 13 is disposed between the APD 11 and the temperature compensation diode 12.

The peripheral carrier absorbing portion 83 may surround each of the plurality of APDs 81 included in the APD array 80. In other words, the peripheral carrier absorbing portion 83 may surround the plurality of APDs 81 included in the APD array 80 one by one. Any APD 81 among the plurality of APDs 81 may be used as a temperature compensation diode. Also in this case, the carriers generated from the APD 81 used as a temperature compensation diode are suppressed from reaching the other APDs 81.

In the above modification examples, the configuration in which the semiconductor substrate 10C includes the semiconductor layer 36 has been described. However, the APD 91 of the semiconductor substrate 10C does not have to include the semiconductor layer 36. Even in this case, the APD 91 of the semiconductor substrate 10C functions as an APD. In the configuration in which the semiconductor substrate 10C does not include the semiconductor layer 36, for example, the semiconductor region 21 and the semiconductor layer 35 are in contact with each other without the semiconductor layer 36 interposed therebetween.

REFERENCE SIGNS LIST 1, 1C: light detection device, 10, 10A, 10B, 10C: semiconductor substrate, 10a, 10b: main surface, 11, 81, 81a, 91: APD, 11a, 91a: light incidence surface, 12, 82, 92: temperature compensation diode, 13, 83, 93: peripheral carrier absorbing portion, 13a, 13b, 83a, 83b, 93a, 93b: edge, 13c, 83c, 93c: portion, 21: semiconductor region, 31, 32, 33, 36: semiconductor layer, 42, 43, 44, 45: electrode, 80: APD array, L1, L2, L3, L4: distance.

The invention claimed is:

1. A method for manufacturing a light detection device, comprising:
    preparing a semiconductor wafer having a first main surface and including a semiconductor region of a first conductivity type; and
    implanting impurity ions into the semiconductor wafer to form a semiconductor substrate that has the first main surface and a second main surface facing the first main surface and forms an avalanche photodiode and a temperature compensation diode so as to be spaced apart from each other when viewed from a direction perpendicular to the first main surface,
    wherein the light detection device is a light detection device which includes the semiconductor substrate and in which a voltage corresponding to a breakdown voltage applied to the temperature compensation diode is applied to the avalanche photodiode as a bias voltage to provide temperature compensation for a multiplication factor of the avalanche photodiode, and
    the forming the semiconductor substrate includes:
    a first ion implantation process of implanting impurity ions into a first portion and a second portion in the semiconductor wafer to form, in each of the first and second portions, a first semiconductor layer of a second conductivity type different from the first conductivity type and a second semiconductor layer of the first conductivity type, the first portion and the second portion being spaced apart from each other when viewed from the direction perpendicular to the first main surface, the second semiconductor layer being located between the semiconductor region and the first semiconductor layer and having a higher impurity concentration than the semiconductor region; and
    a second ion implantation process of further implanting impurity ions into the second semiconductor layer in the first portion.

2. The method for manufacturing a light detection device according to claim 1,
    wherein the first ion implantation process includes:
    implanting impurity ions of the second conductivity type into the first and second portions and a third portion being spaced apart from the first and second portions when viewed from the direction perpendicular to the first main surface, to form the first semiconductor layer in each of the first and second portions and form a third semiconductor layer of the second conductivity type in the third portion by one ion implantation process; and
    implanting impurity ions of the first conductivity type into the first and second portions to form the second semiconductor layer in each of the first and second portions.

* * * * *